(12) United States Patent
Sasao

(10) Patent No.: US 8,285,922 B2
(45) Date of Patent: Oct. 9, 2012

(54) ADDRESS GENERATOR USING LUT CASCADE LOGIC NETWORK

(75) Inventor: Tsutomu Sasao, Iizuka (JP)

(73) Assignee: Kyushu Institute of Technology, Kitakyushu-shi (JP)

( * ) Notice: Subject to any disclaimer, the term of this patent is extended or adjusted under 35 U.S.C. 154(b) by 447 days.

(21) Appl. No.: 12/294,791

(22) PCT Filed: Mar. 27, 2007

(86) PCT No.: PCT/JP2007/056497
§ 371 (c)(1),
(2), (4) Date: May 20, 2010

(87) PCT Pub. No.: WO2007/119539
PCT Pub. Date: Oct. 25, 2007

(65) Prior Publication Data
US 2010/0228947 A1    Sep. 9, 2010

(30) Foreign Application Priority Data

Mar. 31, 2006  (JP) .................................. 2006-101104

(51) Int. Cl.
    *G06F 12/02* (2006.01)
(52) U.S. Cl. ..................................... 711/108; 365/49.17
(58) Field of Classification Search .................. 711/108; 365/49.17
    See application file for complete search history.

(56) References Cited

U.S. PATENT DOCUMENTS 5,063,573 A    11/1991    Langewellpott
6,493,793 B1 *  12/2002   Pereira et al. ................. 711/108
2003/0093616 A1 *  5/2003 Slavin ............................ 711/108

FOREIGN PATENT DOCUMENTS

| JP | 64-76320 | 3/1989 |
|---|---|---|
| JP | 2003-389264 A1 | 11/2003 |
| JP | 2004-229163 A1 | 8/2004 |
| JP | 2004-258799 A1 | 9/2004 |
| JP | 2004-295967 A1 | 10/2004 |

OTHER PUBLICATIONS

Susumu Koyama; "Ultrahigh-speed MOS Device;" Ultrahigh-speed Digital Device Series; vol. 2; Feb. 10, 1986; pp. 324-326 and Cover Sheet (4 Sheets total); Baifukan, Tokyo, Japan/Cited at p. 5.

(Continued)

*Primary Examiner* — Jared Rutz
(74) *Attorney, Agent, or Firm* — Kratz, Quintos & Hanson, LLP

(57) ABSTRACT

The address generator has a hash network for producing hashed Y1, which is obtained by hushing X1, to an input vector X=(X$_1$, X$_2$), a tentative address generator Y$_1$ for making an address generation function f(X) to a tentative address A' when no hash collision occurs and otherwise making one of unique addresses A to A', a data regenerator for producing X"=f$^{-1}$(A'), a unique address generator for producing A' when X" coincides with X and otherwise producing "invalid value", a complementary address generator for producing (X) to X, to which the unique address generator produces "invalid value", and otherwise producing "invalid value", and an output combiner which produces, when the outputs of the unique address generator and the complementary address generator have values other than the "invalid value", the values as a unique address A and otherwise produces "invalid value" as A.

4 Claims, 10 Drawing Sheets

OTHER PUBLICATIONS

The Institute of Electronics and Communication Engineers; LSI Handbook; Nov. 30, 1984; pp. 522-525 and Cover Sheet (5 Sheets total); Ohmsha, Tokyo, Japan/Cited at p. 5.

Kostas Pagiamtzis, et al.; "A Low-Power Content-Addressable Memory (CAM) Using Pipelined Hierarchical Search Scheme;" IEEE Journal of Solid-State Circuits; vol. 39; No. 9; Sep. 2004; pp. 1512-1519/Cited at p. 5.

Tsutomu Sasao, et al; "A Cascade Realization of Multiple-Output Function for Reconfigurable Hardware;" International Workshop on Logic and Synthesis (IWLS01); Lake Tahoe, California; Jun. 12-15, 2001; pp. 1-6/Cited at p. 5.

Tsutomu Sasao, et al; "BDD Representation for Incompletely Specified Multiple-Output Logic Functions and Its Applications to Functional Decomposition;" Design Automation Conference; Jun. 2005; pp. 373-378/Cited at p. 5.

Hui Qin, et al; "Implementation of LPM Address Generators on FPGAs;" Reconfigurable Computing: Architectures and Applications. Second International Workshop, ARC2006 (Lecture Notes in Computer Science vol. 3985); Mar. 3, 2006; 12 Sheets.

International Search Report for international Application No. PCT/JP2007/056497 dated May 31, 2007.

* cited by examiner

ADDRESS GENERATOR USING LUT CASCADE LOGIC NETWORK

TECHNICAL FIELD

The present invention relates to an address generator for producing a unique address corresponding to an input vector, and more particularly to an address generator capable of easily perform rewriting as well as being mounted in a small circuit area.

BACKGROUND ART

It is assumed that a set of k pieces (k is a natural number) of different binary vectors is called a set of registered vectors. Unique addresses from 1 to k are injected to inputs which coincide with the respective elements of the set of the registered vectors, and a function acting as 0 with respect to the inputs other than the above inputs is called an address generation function. Further, a network for calculating the address generation function is called an address generator. A vector that is applied to the address generator is called an input vector. An address generation function whose input vector is an n-dimensional vector is called an n-input address generation function. Further, a network for calculating the n-input address generation function is called an n-input address generator.

The address generator is also called an associative memory or a content addressable memory (CAM) and used in a wide field of such as pattern matching, a router of the Internet, a cache of a processor, TLB (Translation Lookaside Buffer), data compression, an accelerator of a database, a neural net, a memory path, and the like.

Although it is also possible to realize the function of the address generator using software, the speed of the address generator realized by software is very slow. Accordingly, the address generator is often realized using dedicated hardware (semiconductor memory). A conventional address generator composed of hardware will be explained below.

FIG. 9 is a block diagram showing an example of a basic configuration of a conventional address generator (CAM) (refer to Patent Document 1). The address generator 100 has a comparison register 101, a search bit-line driver 102, k pieces of words $W_1$ to $W_k$, k pieces of coincidence sensing circuits $MSC_1$ to $MSC_k$, k pieces of coincidence flag registers $MFR_1$ to $MFR_k$, and a priority encoder (coding circuit with priority) PE.

The comparison register 101 is a register for storing n-bit input vectors. The search bit-line driver 102 drives the respective bits of the comparison register 101 on a search bit line. Each of the words $W_1$ to $W_k$ has an n-bit CAM cell.

FIG. 10 is an configuration circuit view of the CAM cell of FIG. 9. The CAM cell 103 exemplified in FIG. 10 is of an incoincidence detection type. The CAM cell 103 is composed of a memory cell 104 and a coincidence comparison circuit 105. The memory cell 104 is a memory cell composed of an SRAM for storing one-bit data. In FIG. 10, D shows data, and DN shows reverse data. The coincidence comparison circuit 105 compares one-bit data stored in the memory cell 104 with an input vector driven on a pair of search bit lines SL, SLN and produces the result of comparison of coincidence on a coincidence line ML.

The coincidence comparison circuit 105 has three nMOS transistors (hereinafter, called "nMOSs") 106, 107, 108. The nMOSs 106, 107 are connected in series between the search bit lines SLN and SL. The gates of the nMOSs 106, 107 are connected to the data D and the reverse data DN of the memory cell 104, respectively. The nMOS 108 is connected between the coincidence line ML and the ground. The gate of the nMOS 108 is connected to a node 109 between the nMOSs 106, 107.

First, before a search is performed, registered vectors as objects to be searched are stored in the respective words $W_1$ to $W_k$ of the address generator 100. The respective CAM cells 103 in the respective words write data to the memory cell 104 and read out data from the memory cell 104 likewise an ordinary SRAM.

When the search is performed, first, an input vector is stored in the comparison register 101. The respective bits of the input vector are driven on the search bit lines corresponding thereto by the search bit-line driver 102, respectively.

In the respective words $W_1$ to $W_k$, the coincidence between the registered vectors previously stored in the respective CAM cells 103 and the input vector driven on the search bit line is simultaneously searched (in parallel), and the results are produced on the coincidence lines $ML_1$ to $ML_k$. The results of search of them are applied to the respective coincidence sensing circuits $MSC_1$ to $MSC_k$. The respective coincidence sensing circuits $MSC_1$ to $MSC_k$ amplify the results of search and produce them to the coincidence sense output lines $MT_1$ to $MT_k$ as coincidence sense produces. The respective coincidence sense outputs are stored in the coincidence flag registers $MFR_1$ to $MFR_k$ and produced to coincidence flag output lines $MF_1$ to $MF_k$ as coincidence flag produces. It is assumed that the coincidence flag set to '1' shows "coincidence" and the coincidence flag set to '0' shows "incoincidence".

The respective coincidence flag outputs are applied to a priority encoder PE. The priority encoder PE selects the address of the word having the highest priority order from the words whose coincidence is detected according to a predetermined priority order (highest priority coincidence address: HMA) and produces the address. It is assumed that the priority order of the respective words is such that the word $W_1$ has the highest priority order, and the priority order is sequentially lowered toward the word $W_k$.

Note that the coincidence search in the respective CAM cells 103 in the respective words $W_1$ to $W_k$ is performed as described below.

First, an initialization operation is performed. In the initialization operation, both the pair of the search bit lines SL, SLN are set to 'L'(='0'). In contrast, one of the nMOSs 106, 107 of the coincidence comparison circuit 105 is placed in an ON state and the other of them is placed in an OFF state according to the data stored in the memory cell 104. Accordingly, the level of the node 109 between both the nMOSs 106, 107 is set to 'L' and the nMOS 108 is placed in the OFF state through one of the nMOSs 106, 107 which is placed in the ON state. In the state, the coincidence line ML is precharged to an 'H' (='1') state. Note that the coincidence line ML that is set to 'H' is shows "coincidence".

Next, the respective bits of the input vector stored in the comparison register 101 through the search bit line are applied to the respective CAM cells 103. With this operation, any one of the pair of the search bit lines SL, SLN is set to 'H' and the other of them is set to 'L' according to the input vector S.

When the data D stored in the memory cell 104 coincides with the input vector S, the level of the node 109 is set to 'L', and the nMOS 108 is kept in the OFF state.

In contrast, when the data D does not coincide with the input vector S, the level of the node 109 is set to 'H', and the nMOS 108 is placed in the ON state. With this operation, the coincidence line ML is discharged and placed in an 'L' state.

The coincidence line ML of a CAM word composed of the n-bit CAM cells 103 constitute a wired OR circuit to which the nMOSs 108 of the respective CAM cells 103 are connected in parallel. Accordingly, only when coincidence is detected in all the n-bit CAM cells 103 which constitute one word, the coincidence line ML is held in the 'H' ("coincidence") state. In contrast, when incoincidence is detected in the CAM cells 103 even in one bit, the coincidence line ML is placed in an 'L' ("incoincidence") state.

For example, it is assumed that '0', '1', '1', '0', ..., '1', and '0' are stored in the coincidence flag registers $MFR_1$ to $MFR_k$ as coincidence flags as a result of the search. In this case, the coincidence is detected in the words $W_2, W_3, \ldots, W_{k-1}$. Accordingly, the priority encoder PE produces the address of the word $W_2$ having the most priority order as HMA. Further, the address of the word $W_3$ having the next highest priority order can be produced as HMA by clearing the coincidence flag stored in the coincidence flag register MFR2 to '0', Hereinafter, the addresses of the words whose coincidence is detected can be sequentially produced likewise.

FIG. 11 is a circuit diagram of an configuration of other example of the CAM cell of FIG. 9. A CAM cell 103' shown in FIG. 11 is of a coincidence detection type and has a memory cell 104 composed of an SRAM and a coincidence comparison circuit 105 likewise FIG. 10. The CAM cell 103' is different from the CAM cell 103 of FIG. 10 in that the coincidence comparison circuit 105 is connected to an nMOS 108 in a different manner. The nMOS 108 of FIG. 11 is connected between a coincidence line $ML_a$ and a coincidence line $ML_b$. The gate of the nMOS 108 is connected to a node 109 between nMOS transistors 106, 107.

In the CAM cell 103', when a search is performed, both a pair of bit lines SL, SLN are set to 'H' as an initialization operation. In contrast, one of the nMOSs 106, 107 of the coincidence comparison circuit 105 is placed in the ON state and the other of them is placed in the OFF state according to the data stored in the memory cell 104. Accordingly, the level of the node 109 between both the nMOSs 106, 107 is set to 'H' and the nMOS 108 is placed in the ON state through one of the nMOSs 106, 107 which is in the ON state. In this state, one end of the coincidence line ML is precharged to the 'H'(='1') state. Note that the coincidence line ML that is set to 'H' shows "incoincidence".

The coincidence line ML of CAM words composed of the n-bit CAM cells 103 constitute an AND circuit to which the nMOSs 108 of the respective CAM cells 103' are serially connected. Accordingly, the coincidence lines $ML_a$, $ML_b$ of the respective CAM cells are precharged to 'H' through the nMOSs 108 of the respective CAM cells 103'.

Thereafter, the respective bits of the input vector stored in a comparison register 101 are applied to the respective CAM cells 103' through a search bit line. With this operation, any one of the pair of the search bit lines SL, SLN is set to 'H' and the other of them is set to 'L' according to the input vector S.

When the data D stored in the memory cell 104 coincides with the input vector S, the level of the node 109 is 'H', and the nMOS 108 is held in the ON state.

Whereas, when the data D does not coincide with the input vector S, the level of the node 109 is set to 'L', and the nMOS 108 is placed in the OFF state.

After all the states of the n-bit CAM cells 103' of the CAM words are fixed, a discharge is started from one end of the coincidence line ML, and a result of comparison of coincidence is determined by the other end thereof. At the time, when there is an incoincident CAM cell 103' even in one bit, the result of coincidence of comparison is 'H', that is, the result is held in the state of incoincidence. In contrast, only when incoincidence is detected in all the CAM cells 103', the result of comparison of coincidence is set to 'L', that is, it is placed in a coincidence state.

[Patent Document 1]
Japanese Unexamined Patent Application Publication No. 2004-295967
[Patent Document 2]
Patent Application No. 2003-389264
[Patent Document 3]
Japanese Unexamined Patent Application Publication No. 2004-258799
[Patent Document 4]
U.S. Pat. No. 5,063,573
[Non-Patent Document 1]
"Ultra high speed device series 2 Ultra high speed MOS device", supervised by Tadao Kanno, edited by Susumu Koyama, first edition, Baihukan, February 1986, pp. 324-325.
[Non-Patent Document 2]
"LSI hand book", edited by The Institute of Electronics, Information and Communication Engineers, first edition, Ohm Sha, November 1994, pp 523-525.
[Non-Patent Document 3]
Kostas Pagiamtzis and Ali Sheikholeslami, "A Low-Power Content-Addressable Memory (CAM) Using Pipelined Hierarchical Search Scheme", IEEE Journal of Solid-State Circuits, Vol. 39. No. 9, September 2004, pp. 1512-1519.
[Non-Patent Document 4]
T. Sasao, M. Matsuura, and Y. Iguchi, "A cascade realization of multi-output function for reconfigurable hardware", International Workshop on Logic and Synthesis (IWLSO1), Lake Tahoe, Calif., Jun. 12-15, 2001, pp. 225-230.
[Non-Patent Document 5]
T. Sasao and M. Matsuura, "BDD representation for incompletely specified multiple-output logic functions and its applications to functional decomposition", Design Automation Conference, June 2005, (pp. 373-378).

DISCLOSURE OF THE INVENTION

Problems to be Solved by the Invention

An n-input address generation function is a so-called sparse logic function in which, ordinarily, the number k of input vectors whose output value is made to non-zero is sufficiently smaller than the number $2^n$ which is a combination of all the n-dimensional vectors.

A set of registered vectors of, for example, n=128, k=40000 will be examined. In this case, the ratio of the number of the input vectors to the number to which the input vectors can be set is $40000/2^{128}=1.17549 \times 10^{-34}$. A most simple method of realizing an address generator to the set of the registered vectors is a truth table. However, it is not practical to directly store the truth table in a memory because the memory becomes excessively large.

Further, the address generator can be also realized even by the conventional address generator described above, a two-stage logic network, a PLA (Programmable Logic Array). However, when an LSI is employed in the set of the registered vectors, a problem arises in that a chip area and power consumption become excessively large. Further, in the conventional address generator described above, a cost per bit (bit cost) becomes more expensive than a RAM.

For example, although the speed of the conventional address generator is higher than that of the RAM because it can perform searches in parallel, it has a complex device configuration. Accordingly, the cost per bit (bit cost) of the address generator is more expensive than the RAM.

Further, a power consumption per bit is much larger than that of the RAM (refer to Non-Patent Document 3). This is because all the CAM cells are accessed at the same time as explained above. Accordingly, the power consumption per bit becomes about several tens as large as that of an ordinary RAM.

Accordingly, an object of the present invention is to provide an address generator which can suppress power consumption as well as simplify the structure of a device and can be mounted in a small circuit area while maintaining a high speed search property.

Means for Solving the Problems

Before an constitution of the present invention is explained, first, the terms used in the description will be defined, and a basic principle of the present invention will be explained.

[1] Definition of Terms and Several Theorems

[Definition 1] (Address Generation Function)

In function $f(X): B^n \to (0, 1, \ldots, k)$, $(B=(0, 1)$, k∈natural number), when $f(a_i)=i$ $(i=1, 2, \ldots, k)$ is established to k pieces of different registered vectors $a_i \in Bn$ $(i=1, 2, \ldots, k)$ and $f(a_i)=0$ is established to $(2^n-k)$ pieces of input vectors $a_i$ other than the above mentioned, $f(X)$ is called an address generation function having a weight k. The address generation function generates unique addresses of from 1 to k to k pieces of different binary vectors.

(End of definition)

In the description, it is assumed that the value of k is sufficiently smaller than the total number $2^n$ of a combination of the input vectors $(k<<2^n)$.

[Definition 2] (Registered Vector, Registered Vector Table)

A set of k pieces of n-bit vectors will be examined. The set of the vectors is called a set of registered vectors, and the respective vectors that belong to the set of the registered vectors is called registered vectors. A table, in which each of integers of from 1 to k are caused to correspond to each of all the registered vectors that belong to the set of the registered vectors is called a registered vector table.

(End of definition)

EXAMPLE 1

(Table 1) shows a registered vector table composed of seven pieces of 4-bit registered vectors. (Table 2) shows address generation functions corresponding to the registered vector table. Any of the address generation functions produces an address that corresponds to an input vector that coincides with the registered vectors as a 3-bit number (for example, '001'). When there is no registered vector which coincides with the input vector in the registered vector table, '000' is produced.

(End of example)

TABLE 1

Table of Registered Vector

| Intrinsic address | Registered vector | | | |
|---|---|---|---|---|
| $f_2 f_1 f_0$ | $x_4$ | $x_3$ | $x_2$ | $x_1$ |
| 001 | 0 | 0 | 1 | 0 |
| 010 | 0 | 1 | 1 | 1 |
| 011 | 1 | 1 | 0 | 1 |
| 100 | 0 | 1 | 0 | 1 |
| 101 | 0 | 0 | 1 | 1 |
| 110 | 1 | 0 | 1 | 1 |
| 111 | 0 | 0 | 0 | 1 |

TABLE 2

Address Generation Function

| $x_4$ | $x_3$ | $x_2$ | $x_1$ | $f_2$ | $f_1$ | $f_0$ |
|---|---|---|---|---|---|---|
| 0 | 0 | 0 | 0 | 0 | 0 | 0 |
| 0 | 0 | 0 | 1 | 1 | 1 | 1 |
| 0 | 0 | 1 | 0 | 0 | 0 | 1 |
| 0 | 0 | 1 | 1 | 1 | 0 | 1 |
| 0 | 1 | 0 | 0 | 0 | 0 | 0 |
| 0 | 1 | 0 | 1 | 1 | 0 | 0 |
| 0 | 1 | 1 | 0 | 0 | 0 | 0 |
| 0 | 1 | 1 | 1 | 0 | 1 | 0 |
| 1 | 0 | 0 | 0 | 0 | 0 | 0 |
| 1 | 0 | 0 | 1 | 0 | 0 | 0 |
| 1 | 0 | 1 | 0 | 0 | 0 | 0 |
| 1 | 0 | 1 | 1 | 1 | 1 | 0 |
| 1 | 1 | 0 | 0 | 0 | 0 | 0 |
| 1 | 1 | 0 | 1 | 0 | 1 | 1 |
| 1 | 1 | 1 | 0 | 0 | 0 | 0 |
| 1 | 1 | 1 | 1 | 0 | 0 | 0 |

[Definition 3] (Partition)

The input vector is shown by $X=(x_1, x_2, \ldots, x_n)$. A set of variables of X is shown by $\{X\}$. When $\{X_1\} \cup \{X_2\}=\{X\}$ as well as $\{X_1\} \cap \{X_2\}=\phi$, $X=(X_1, X_2)$ is called a partition of X. Here, $\phi$ shows an empty set.

(End of definition)

[Definition 4] (Degradation Table, Basic Degradation Table, Degree of Column Complexity)

It is assumed that completely defined function $f(X): B^n \to B^q$ $(B=\{0, 1\}, X=(x_1, x_2, \ldots, x_n)$, n, q∈natural number) are given. It is assumed that $(X_L, X_H)$ is a partition of X. The dimension of X (the number of pieces of variables) is denoted by $d(X)$. A table, which satisfies the following conditions (1) to (3) to the function $f(X)$ and the partition of X $X=(X_L, X_H)$ is called a degradation table of f $2^{nL}$ column $2^{nH}$ row:

(1) a table of $2^{nL}$ column $2^{nH}$ row, wherein it is assumed that $n_L=d(X_L)$, $n_H=d(X_H)$;

(2) It is assumed that the respective rows and the respective columns have a label of a binary code, and the sets of the labels of the columns and the rows use all the patterns of $n_L$, $n_H$ bits as elements, respectively; and (3) The respective elements of the table are the truth values $f(X_L, X_H)$ of f to a combination $(X_L, X_H)$ of the columns and the rows corresponding to the labels.

$X_L$ is called a bound variable, and $X_H$ is called a free variable.

The number of pieces of different column patterns of the degradation table is called a degree of column complexity of the degradation table and shown by $\mu$. A case of $X_L=X$, $X_H=\phi$ is also examined as a special case of the degradation table.

Further, in the degradation tables of the function f, a degradation table in which $X_L=(x_1, x_2, \ldots, x_{nL})$ as well as $X_H=x_{nL+1}, X_{nL+2}, \ldots, x_n)$, is called a basic degradation table.

(End of definition)

EXAMPLE 2

In the degradation table of (Table 3), $n_L=3$, $n_H=2$, $\mu=2$.

TABLE 3

Example of Degradation Table

|     |     | $X_L$ |   |   |   |   |   |   |   |     |
|-----|-----|---|---|---|---|---|---|---|---|-----|
|     |     | 0 | 0 | 0 | 0 | 1 | 1 | 1 | 1 | $x_3$ |
|     |     | 0 | 0 | 1 | 1 | 0 | 0 | 1 | 1 | $x_2$ |
|     |     | 0 | 1 | 0 | 1 | 0 | 1 | 0 | 1 | $x_1$ |
|     | 0 0 | 0 | 1 | 0 | 0 | 0 | 1 | 1 | 0 |     |
|     | 0 1 | 1 | 1 | 1 | 1 | 1 | 1 | 1 | 1 |     |
| $X_H$ | 1 0 | 1 | 0 | 1 | 1 | 1 | 0 | 0 | 1 |     |
|     | 1 1 | 0 | 1 | 0 | 0 | 0 | 1 | 1 | 0 |     |
|     | $x_5$ $x_4$ |   |   |   |   |   |   |   |   |     |

[Definition 5] (C Scale)

When the order of the variables of a vector X is shown by $X=(x_1, x_2, \ldots, x_n)$, a maximum value of the degree of column complexity of the basic degradation table of a logic function f(X) is called a C scale of f.

(End of definition)

EXAMPLE 3

Although the C scale of $f_1 = x_1 x_2 \vee x_3 x_4 \vee x_5 x_6$ is 3, the C scale of $f_2 = x_1 x_5 \vee x_2 x_6 \vee x_3 x_4$ is 8.

(End of example)

The degree of column complexity of the degradation table is equal to the width of MTBDD (Multi-Terminal Binary Decision Diagram). Accordingly, the C scale of the logic function is equal to a maximum value of the MTBDD in the given order of input variables. The C scale can be easily calculated to a given logic function $f(x_1, x_2, x_n)$ and uniquely determined. As described later, a function having a small C scale can be efficiently realized by a LUT cascade. Accordingly, the C scale acts as a scale of complexity when the logic function is realized by the LUT cascade.

[Lemma 1]

The C scale of the logic function f having a weight k is k+1 at the highest.

(End of Lemma)

[Theorem 1]

It is assumed that $X_L$ shows the free variable of the degradation table, $X_H$ shows the bound variable of the degradation table, and $\mu$ shows the degree of column complexity of the degradation table with respect to a given function f(X). At the time, the function f can be realized by the circuit shown in FIG. 1. In this case, the number of signal lines connecting between two blocks H, G is as shown by Expression 1 at the highest.

$$\lceil \log_2 \mu \rceil \quad \text{[Expression 1]}$$

(End of theorem)

[Definition 6] (Functional Decomposition)

It is called a functional decomposition to decompose one function $f(X)=f(X_L, X_H)$ and to realize it as two functions G, H (however, $f(X)=(G(H_1(X_L)), X_H)$). The functions G, H, which can be obtained by the functional decomposition, is called a subfunction of the decomposition.

(End of definition)

In FIG. 1, when the number of the signal lines connecting between the two blocks are smaller than the number of pieces of variables in $X_L$, there is a possibility that the amount of the memory for realizing the function can be reduced. A LUT cascade shown in FIG. 2 can be obtained by repeatedly subjecting the given function to the functional decomposition.

[Definition 7] (LUT Cascade)

Subfunctions, which can be obtained by repeatedly subjecting one function f(X) to the functional decomposition are shown by $G_1, G_2, \ldots, G_s$.

$$R_1 = G_1(X_1) \quad \text{[Expression 2]}$$

$$R_2 = G_2(X_2, R_1)$$

$$R_3 = G_3(X_3, R_2)$$

$$\vdots$$

$$R_x = G_x(X_x, R_{x-1})$$

$$f(X) = R_x$$

$$X = (X_1, X_2, \ldots, X_x)$$

The respective subfunctions $G_1, G_2, \ldots, G_s$ are realized by a look up table (LUT), and when respective LUTs are cascade-connected by signal lines, they are called a LUT cascade. The respective LUTs which show the respective subfunctions $G_1, G_2, \ldots, G_s$ are called cells. Signal lines, which connect between adjacent cells, are called rails.

(End of definition)

[Theorem 2]

A logic function having the C scale of $\mu$ can be realized by a LUT cascade composed of a cell having the number of inputs of q+1 at the highest and the number of outputs of q. Here, Expression 3 is shown as follows.

$$q = \lceil \log_2 \mu \rceil \quad \text{[Expression 3]}$$

(End of theorem)

[Theorem 3]

A LUT cascade for realizing the function f will be examined. It is assumed that n shows the number of external inputs, s shows the number of cells, q shows the maximum number of rails (the number of signal lines between the cells), p shows the maximum input number of the cells, and $\mu$ shows the C scale of the function f.

$$p \geq \lceil \log_2 \mu \rceil + 1 \quad \text{[Expression 4]}$$

When Expression 4 is established, there exists a LUT cascade that realizes a function f satisfying the following relation.

$$s \leq \left\lceil \frac{n-q}{p-q} \right\rceil \quad \text{[Expression 5]}$$

(End of theorem)

An address generation function having the weight of k can be realized by a LUT cascade the number of rails of which is shown by Expression 6.

$$\lceil \log_2(k+1) \rceil \quad \text{[Expression 6]}$$

However, when k has a large value, it is difficult to realize the address generation function by a single cascade because a cell becomes excessively large. When, for example, k=40000, a cell having 17 inputs and 16 outputs is necessary. In this case, the amount of necessary memory can be reduced by decomposing a set of vectors to several sets of vectors and realizing the sets of the respective vectors by independent cascades. However, in this case, an encoder is necessary to integrate the outputs of a plurality of the cascades.

[2] Principle of the Present Invention
(1) Method Using One Hash Memory (Hybrid Method)

In the address generation function $f(X_1, X_2)$ having the weight of k, an input variable $(X_1, X_2)$ is subjected to primary conversion to $(Y_1, Y_2)$, and an address space is hashed. A degradation table (FIG. 3) of a function after the address space is hashed will be examined.

[Expression 7]

$$\hat{f}(Y_1, X_2) \quad (1)$$

Note that, hereinafter, an expression suffixed with "^" as in Expression 8 is shows as "f ^" in the text.

[Expression 8]

$$\hat{f}$$

The number of variables (bound variables) of $Y_1$ is shown by p. When it is assumed that non-zero elements are uniformly distributed in the degradation table, the degradation table has one non-zero element in average at the highest when $2^p > k$. For the purpose of simplification, it is assumed that the degradation table has one non-zero element in each column at the highest. Next, $\hat{h}(Y_1)$ is realized by a hash memory 3' using Expression 9 (refer to FIG. 5).

[Expression 9]

$$\hat{h}(Y_1) = \begin{cases} 0 & \text{(when all the elements of column } Y_1 \text{ are 0)} \\ \text{minimum value of non-zero elements in column } Y_1 & \text{(when non-zero elements exist in column } Y_1) \end{cases} \quad (2a)$$

or $$\hat{h}(Y_1) = \max_{b \in B^{n_2}} \hat{f}_1(Y_1, b) \quad (n_2 \text{ is the number of elements } X_2) \quad (2b)$$

Although the input of a function $\hat{f}$ is $(Y_1, X_2)$, since $\hat{h}(Y_1)$ can predict the value of $\hat{f}$ only by the value of $Y_1$, there is a possibility that the value of $\hat{h}(Y_1)$ is different from the value of $\hat{f}$. Thus, whether or not the value of $\hat{h}(Y_1)$ is correct is checked by an auxiliary (AUX) memory 4'. The number of inputs of the auxiliary memory 4' is shown by Expression 10, and the number of outputs thereof is n (actually, it can be reduced up to n−p)

[Expression 10]

$$q = \lceil \log_2(k+1) \rceil \quad (3)$$

Corresponding registered vectors are stored in the respective addresses of the auxiliary memory 4'. When the search patterns of the output and the input of the auxiliary memory 4' are equal to each other, since the hash memory 3' produces a correct value, the output value of the hash memory 3' is produced as it is. When they are not equal each other, since the hash memory 3' produces a value different from $\hat{f}$, 0 is produced.

When a column has two or more non-zero elements (when hash collision occurs), since the above method cannot be used, $\hat{f}(Y_1, X_2)$ is subjected to functional decomposition using Expression 11 so that one non-zero element exists at the highest in the respective columns of the degradation table of the function $\hat{f}_1(Y_1, X_2)$.

$$\hat{f}(Y_1, X_2) = \hat{f}_1(Y_1, X_2) \vee \hat{f}_2(Y_1, X_2), \hat{f}_1(Y_1, X_2) \cdot \hat{f}_2(Y_1, X_2) = 0 \quad \text{[Expression 11]}$$

Further, the function $\hat{f}_2(Y_1, X_2) = f_2(X_1, X_2)$ is realized by a reconfigurable logic network such as a LUT cascade, a reconfigurable PLA (refer to, for example, Patent Document 4) and the like. Here, $f_2(X_1, X_2)$ shows a function that can be obtained by converting the hashed bound variable $Y_1$ of $\hat{f}_2$ $(Y_1, X_2)$ into a bound variable $X_1$.

Note that the function $\hat{f}_1(Y_1, X_2)$ is called a master address generation function. Further, the function $f_2(X_1, X_2)$ is called a slave address generation function.

The address generator has the following features. Although the hash memory 3' effectively realizes the address generation function, since hash collision occurs, a part of the registered vectors cannot be expressed. In contrast, although the reconfigurable logic network such as the LUT cascade, the reconfigurable PLA, and the like securely realizes the address generation function, it is ineffective when the value of k is large. Thus, the address generator of FIG. 5 is arranged to effectively realize the address generation function by combining the two methods well. The address generator is effective when the value of n is large and the value of k is sufficiently smaller than $2^n$. About 90% of a set of registered vectors is realized by the hash memory 3' and the auxiliary memory 4', and the remaining 10% of the set of the registered vectors is realized by the reconfigurable logic network 6' such as the LUT cascade, the reconfigurable PLA, and the like.

(2) Method Using Two or More Hash Memories (Super Hybrid Method)

M pieces of different partitions $(X_{1i}, X_{2i})$ $(i=1, \ldots, M)$ will be examined to an input variable X. An address space is hashed to the respective partitions likewise (1), and an address generation function $\hat{f}_{1i}(Y_{1i}, X_{2i})$ is realized using the hash memory 3' and the auxiliary memory 4' (refer to FIG. 7). Then, the address generation function $\hat{f}(Y_1, X_2)$ is subjected to the functional decomposition using Expression 12 so that one non-zero element exists at the highest in the respective columns of the degradation table of the master address generation function $\hat{f}_{1i}(Y_{1i}, X_{2i})$.

$$\hat{f}(Y_1, X_2) = \hat{f}_{11}(Y_{11}, X_{21}) \vee \ldots \vee \hat{f}_{1k}(Y_{1k}, X_{2k}) \vee \hat{f}_2(Y_1, X_2),$$
$$\hat{f}_{1i}(Y_{1i}, X_{2i}) \cdot \hat{f}_2(Y_1, X_2) = 0 \ (i=1, \ldots, M) \quad \text{[Expression 12]}$$

Further, the slave address generation function $\hat{f}_2(Y_1, X_2) = f_2(X_1, X_2)$ is realized by the reconfigurable logic network such as the LUT cascade, the reconfigurable PLA, and the like. Here, $f_2(X_1, X_2)$ shows the function that can be obtained by converting the hashed bound variable $Y_1$ of $\hat{f}_2(Y_1, X_2)$ into the bound variable $X_1$.

When a case that k=2 (refer to FIG. 7) is examined as an example, it is assumed that the master address generation functions $\hat{f}_{11}(Y_{11}, X_{21})$, $\hat{f}_{12}(Y_{12}, X_{22})$ are realized using the two hash memories 3', 3' and the two auxiliary memories 4', 4' to the partitions $(X_{11}, X_{21})$, $(X_{12}, X_{22})$ (in FIG. 7, $X_{11}=X_1$, $X_{21}=X_2$, $X_{12}=X_1'$, $X_{22}=X_2'$). The master address generation function $\hat{f}_{11}(Y_{11}, X_{21})$ returns an address A to about 80% of the registered vectors, and the master address generation function $\hat{f}_{12}(Y_{12}, X_{22})$ returns the address A to about 16% of the registered vectors. When $Y_{11}, Y_{12}$ are hashed perfectly at random, the address generation function is realized to about 96% of the registered vectors in all the registered vectors by the master address generation functions $\hat{f}_{11}(Y_{11}, X_{21})$, $\hat{f}_{12}(Y_{12}, X_{22})$. Accordingly, it is sufficient for the slave address generation function $f_2(X_1, X_2)$ to realize the address generation function to the remaining about 4% of the registered vectors. Accordingly, since the slave address generation function $f_2(X_1, X_2)$ that is to be realized by the reconfigurable logic network is made much smaller than the hybrid method, it can be realized by a smaller network.

EXAMPLE 4

An address generation function f(X) having variables and the weight of k will be examined.

[Hybrid Method]

In the hybrid method, the number of inputs of the hash memory 3' is p=q+2, and the number of outputs thereof is q. Here, q is shown by a formula (3). Further, the number of inputs of the auxiliary memory is q, and the number of outputs thereof is (n−q−2). Accordingly, the total amount of the memory is shown by Expression 13.

$$q \cdot 2^{q+2} + (n-q-2) \cdot 2^q = (4n+12q-8) \cdot 2^{q-2}$$ [Expression 13]

[Super Hybrid Method]

In the super hybrid method, the number of inputs of a first hash memory is (q+1), the number of outputs thereof is q, the number of inputs of a first auxiliary memory is q, the number of outputs thereof is (n−q−1), the number of inputs of a second hash memory is (q−1), the number of outputs thereof is (q−2), the number of inputs of a second auxiliary memory is (q−2), and the number of outputs thereof is (n−q+2). Accordingly, the total amount of the memory is shown by Expression 14.

$$q \cdot 2^{q|1} + (n-q-1) \cdot 2^q + (q-2) \cdot 2^{q-1} + (n-q+2) \cdot 2^{q-2} = (5n+5q-6) \cdot 2^{q-2}$$ [Expression 14]

When Expression 15 is established from the above two formulas, the amount of the necessary memory of the super hybrid method is smaller than that of the hybrid method.

$$n \leq 7 \log_2(k|1) - 2$$ [Expression 15]

(End of example)

[3] Constitution of Present Invention

With the first constitution of the address generator according to the present invention, an address generator to perform operation of the address generation function f(X) which produces a unique address A corresponding to a binary input vector (hereinafter referred to simply as "input vector") X if said input vector is a registered vector, otherwise produces "invalid value", comprises:

A. one or more master address generators to produce the unique address A corresponding to said input vector X if said input vector X belongs to a subset of a registered vector set, otherwise produce "invalid value";

B. a slave address generator that produces the unique address A corresponding to said input vector X if all the outputs of the master address generators are "invalid value" and said input vector X which belongs to said registered vector set, otherwise performs operation of a slave address generation function $f_2(X)$ to produce "invalid value" or an unique address A corresponding to said input vector X; and C. an output combiner that produces the output value of the master address generator or the output value of the slave address generator as the unique address $A$ if the output value of the master address generator or the slave address generator are not "invalid value", otherwise produces "invalid value"; wherein said master address generator comprising:

a. a hash network to hash the bound variables $X_n$ to produce the hashed bound variables $Y_n$ for the partition $(X_{1i}, X_{2i})$ of the input vector X, where i denotes an index identifying master address generator;

b. a tentative address generator that produces a unique address A as a tentative address A' if the unique address A corresponds one-to-one to said bound variables $Y_{1i}$ (i.e., when no hash collision occurs), otherwise (i.e., when hash collision occurs), produces an arbitrary value or one of the corresponding unique address A as a tentative address A';

c. a data re-generator that performs operation of data regeneration function $f^{-1}(A)$, which is an inverse function of the address generation function f(X), wherein regenerated vector $X''=f^{-1}(A')$ is produced when said tentative address A' produced by said tentative address generator is applied, and d. a unique address detector that compares said regenerated vector X'' with said input vector X, and produces said tentative address A' if they are identical, otherwise produces "invalid value".

According to the constitution, when the input vector X is applied to the address generator from the outside, the hash network hashes the bound variable $X_{1i}$ to an input vector $X=(X_{1i}, X_{2i})$ and produces it as the hashed bound variable $Y_{1i}$. Here, it is assumed that $X=(X_{1i}, X_{2i})$ is a partition of X. Further, the bound variable $X_n$ is converted into $Y_{1i}$ by the hashing, and the input vector X becomes a hashed input vector $x_{1i}=(Y_{1i}, X_{2i})$.

Next, when no hash collision occur as to $Y_{1i}$, the tentative address generator produces a unique address A corresponding to $Y_{1i}$ as the tentative address A'. When hash collision occurs, any one of an arbitrary value or a corresponding unique addresses A is produced as the tentative address A'. The data regenerator produces the regenerated vector $X''=f^{-1}(A')$ from the obtained tentative address A' in correspondence to the address thereof. When the unique address generator compares X'' with X and they coincide with each other, it produces the tentative address A'. Otherwise, the unique address generator produces "invalid value". With this operation, a correct unique address A or the "invalid value" is produced from unique address generator to the input vector X.

In contrast, the slave address generator produces a correct unique address A=f(X) corresponding to X ("invalid value" when no unique address exists) to the input vector X in which the output of the unique address generator becomes the "invalid value". Whereas, when the output of the unique address generator becomes a value other than the "invalid value", the slave address generator produces the "invalid value" or the correct unique address A=f(X) corresponding to X.

Finally, when the output value of the unique address generator and the output value of the slave address generator include values which are not the "invalid values", the output combiner produces them as the unique address A. When both of them are the "invalid values", the output combiner produces the "invalid values". With this operation, when a registered vector that coincides with the input vector X exists, the correct unique address A corresponding to X is produced from the output combiner.

When the input vector X is hashed once, the address generation function $A=f(X)=f(X_{1i}, X_{2i})$ is converted into $A=f'(Y_{1i}, X_{2i})$. When the number k of the unique address A is sufficiently smaller than the number $2^n$ of a combination of n-dimensional input vectors X, the number of A corresponding to $Y_{1i}$ is one piece in average at the highest. That is, when a hash function is selected well, the allocation of $Y_{1i}$ and A are in a relation of about 1 to 1. Thus, the hash function used in hashing is selected using the value of $Y_{1i}$ so that the probability capable of uniquely determining A can be increased as much as possible. As a result, A can be almost entirely shown as the function $A=G(Y_{1i})$ of the bound variable $Y_{1i}$. Since the number of elements of the input vector $Y_{1i}$ of G is smaller than the number of elements of the input vector X, the tentative address generator can be realized by a small network.

Then, the remaining input vectors X, in which hash collision occurs, are calculated in the slave address generator using A as the function of all the elements of X. At the time, X is limited to those in which hash collision occurs, the number of a combination of As which must be calculated by the slave address generator is small. Accordingly, the slave address generator can be realized by a small network.

Thus, it is possible to reduce the overall network scale of the address generator in its entirety and to suppress power consumption. Further, the structure of a device can be simplified and the device can be mounted in a small area.

Further, when two or more master address generators are provided, since a different partition $(X_{1i}, X_{2i})$ can be performed by the respective master address generator, the ratio of the registered vectors, at which the address generation function is realized by the master address generators, is increased as compared with the case that the one master address generator is employed. Accordingly, since the number of the registered vectors whose address creation function must be realized by the slave address generator can be reduced, it is possible to constitute the address generator by a smaller network scale.

Here, "binary vector" means a vector in which each component of the vector is a binary digit.

"Hashing" means to replace the order of a part or all of the vector components of the input vector X so that non-zero elements are dispersed in many columns in the degradation table of the address generation function. "Hash collision occurs" means that a plurality of unique addresses A correspond to the allocation of bound variables $Y_1$ in which not-hashed vector components are removed from the vector components of a hashed input vector X'.

"Data-regeneration function" means a reverse function of the address generation function f(X), that is, a function for mapping a unique address A to an input vector X corresponding to it.

"Invalid value" means a value showing that an address is invalid (does not exist). A value in which all the components of an address are shown by 0 and all the components are shown by 1, an address value which does not exist actually, and the like are used as the "invalid value".

"Slave address generation function" means a function which produces, when the unique address generator produces "invalid value", the value calculated by the address generation function f(X) to the input vector X and otherwise produces "invalid value" or the value calculate by the address generation function f(X). That is, the slave address generation function maps the input vector X to the unique address A corresponding to it in the former case and maps it to the "invalid value" or to the unique address A corresponding to the input vector X in the latter case.

A LUT cascade and other logic network can be used as the slave address generator.

With the second constitution of the address generator according to the present invention, in the first constitution, said slave address generator produces the unique address A corresponding to the input vector X if the input vector X produces the hash collision for the hashed bound variables $Y_{1i}$, otherwise produces "invalid value" in all of said master address generators.

According to the constitution, when hash collision occurs, the slave address generator produces a correct unique address and, when no hash collision occurs, it produces "invalid value" at all times. Accordingly, it is sufficient to arrange the slave address generator so that it examines X when hash collision occurs and calculates the unique address A to several Xs which are obtained as a result of the examination. Thus, a logic calculation network in the slave address generator can be easily arranged.

With the third constitution of the address generator according to the present invention, in the first constitution, said tentative address generator is a hash memory storing the tentative address generate function as an LUT and the tentative address generate function produces the unique address A corresponding to the bound variables $Y_1$ as a tentative address A', if no hash collision occurs for the hashed bound variables $Y_1$.

Reconfiguration can be also simply performed by rewriting a memory while keeping a high calculation speed by composing the tentative address generator of the hash memory as described above.

With the fourth constitution of the address generator according to the present invention, in the first constitution, said data re-generator is an auxiliary memory storing the data regeneration function $f^{-1}(A)$ as an LUT.

Since the data regenerator is composed of the auxiliary memory as described above, reconfiguration can be also simply performed by rewriting a memory while keeping a high calculation speed.

With the fifth constitution of the address generator according to the present invention, in the first constitution, said slave address generator is configured by an LUT cascade logic network, consisting of plural subfunction memories connected in a cascade, and said each subfunction memory stores subfunction, which is obtained by a functional decomposition of the slave address generation function $f_2(X)$, as an LUT.

Since the slave address generator comprises the LUT cascade logic network, a network scale can be also reduced as compared with a case that it comprises PLA (Programmable Logic Array) while keeping a high calculating speed. Further, reconfiguration can be also simply performed by rewriting the memories while keeping a high calculation speed.

ADVANTAGES OF THE INVENTION

As described above, according to the present invention, the hash network, which hashes an input vector, and the tentative address generator, which produces a unique address from a hashed input vector, are provided as well as the slave address generator, which calculates a unique address that cannot be calculated by the tentative address generator is provided so that the unique address is created by complementarily combining the tentative address generator and the slave address generator. With this constitution, the network scale of the overall address generator can be reduced and power consumption is suppressed as well as the structure of the device is simplified so that it can be mounted in a small area.

Further, since the tentative address generator and the data regenerator are composed of the memory in which the LUT is stored and the slave address generator is composed of the LUT cascade, reconfiguration can be also simply performed by rewriting the memory while keeping a high calculation speed.

EXPLANATION OF REFERENCE NUMERALS

Figure 1:
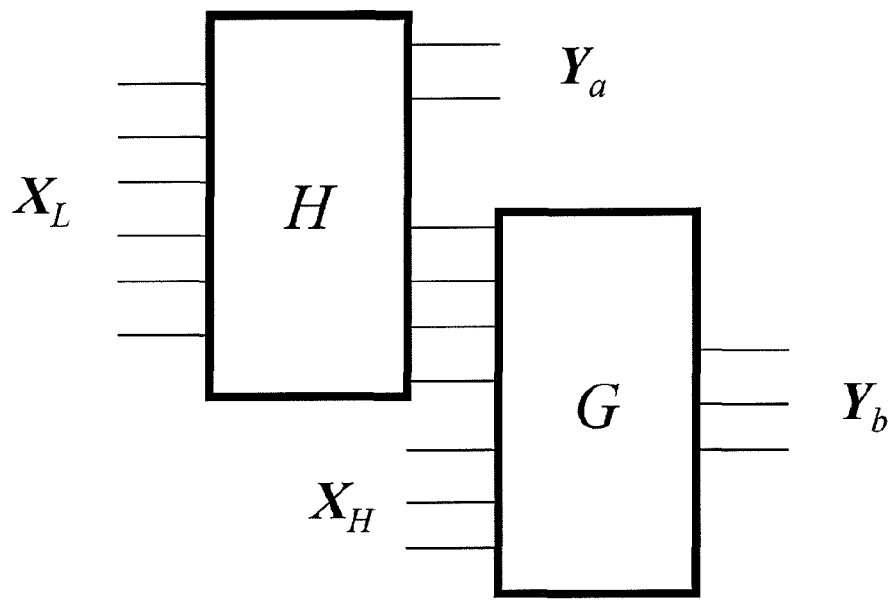
FIG. 1 is a view showing a case that a logic function is realized by functional decomposition.

| | |
|---|---|
| 1, 1' | address generator |
| 2 | hash network |
| 3 | tentative address generator |
| 3' | hash memory |
| 4 | data regenerator |
| 4' | auxiliary memory (AUX memory) |
| 5 | unique address detector |
| 6 | slave address generator |
| 6' | LUT cascade |
| 6" | reconfigurable PLA |
| 7 | output combiner |
| 7' | OR circuit |
| 8, 8' | master address generator |
| 10 | comparison circuit |
| 11 | AND circuit |
| 15 | register |
| 16 | EXNOR gate |
| 17 | AND gate |

BEST MODE FOR CARRYING OUT THE INVENTION

A best mode for carrying out the invention will be explained below referring to the drawings.

[Embodiment 1]

In the embodiment, a case of one master address generator will be explained (hybrid method).

[1] Configuration of Address Generator

Figure 4:
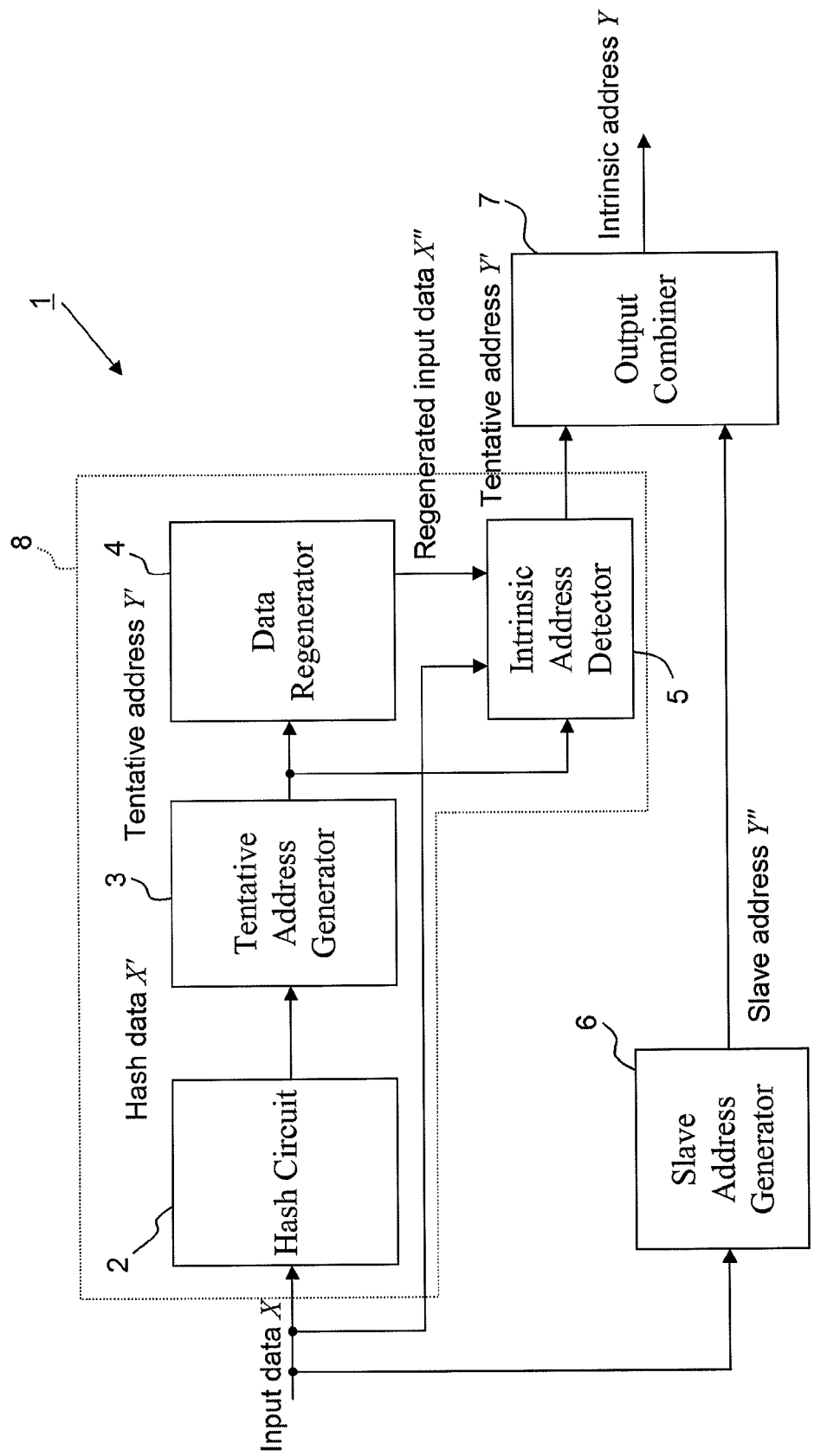
FIG. 4 is a block diagram showing a functional configuration of an address generator according to an embodiment 1 of the present invention.

FIG. 4 is a block diagram showing a functional configuration of the address generator according to the embodiment 1 of the present invention.

The address generator 1 according to the embodiment has a hash network 2, a tentative address generator 3, a data regenerator 4, a unique address detector 5, a slave address generator 6, and an output combiner 7.

The address generator 1 is a calculator for calculating an address generation function f(X) having a weight k. That is, when an input vector X is applied from the outside and a registered vector corresponding to the input vector X exists, the address generator 1 produces a unique address A of the registered vector. Otherwise, the address generator 1 produces "invalid value" 0.

[Expression 16]

$$f(X) = \begin{cases} A & (\text{if } X \in R) \\ 0 & (\text{otherwise}) \end{cases} \quad (4)$$

(however, $A \in \{1, 2, \ldots, k\}$, $R$ is a set of registered vectors)

Here, the input vector X is an n-dimensional vector. Further, the unique address A takes a value of from 1 to k and is expressed by a q-bit binary digit. Here, q is shown by the formula (3) described above.

The hash network 2 hashes a part or all of the input vectors X according to a predetermined hash function. Here, a partition of X is shown by X=(X₁, X₂). X₁ is a bound variable, and X₂ is a free variable. A case of X₁=X is also examined. The hash network 2 hashes the bound variable X₁ of X and generates a hashed input vector X'=(Y₁, X₂).

The tentative address generator 3 generates a tentative address A'. In this case, the tentative address A' is determined as follows:

(1) When one allocation to a hashed bound variable Y₁ does not cause hash collision to occur, a unique address A corresponding to the allocation is shown by a tentative address A'; and (2) When one allocation to a hashed bound variable Y₁ causes hash collision, a smallest unique address A in a set {A₁} of unique addresses A corresponding to the allocation is shown by the tentative address A'.

Hereinafter, a function, which maps one allocation to the bound variable Y₁ (2^p pieces of allocations exist in total) to the tentative address A', is called a tentative address generation function and shown by h^(Y₁).

The data regenerator 4 is a calculator for calculating the reverse function X=f⁻¹(A) of an address generation function A=f(X). The data regenerator 4 produces a regenerated vector X"=f⁻¹(A') to the tentative address A' applied from the tentative address generator 3.

The input vector X, the regenerated vector X", and the tentative address A' are applied to the unique address detector 5. The unique address detector 5 compares the regenerated vector X" with the input vector X. Then, when they coincide with each other, the tentative address A' is produced, otherwise, "invalid value" 0 is produced.

The slave address generator 6 is a calculator for performing a calculation of the slave address generation function f₂^(X), which is in a complementary relation to a calculation of the tentative address A' performed by the tentative address generator 3, the data regenerator 4, and the unique address detector 5, to the address generation function f(X) and producing a slave address A". The slave address generation function f₂^(X) is a function as shown below:

(1) When the unique address detector 5 produces the "invalid value" 0, the input vectors X is mapped to the unique address A corresponding thereto; and (2) Otherwise, the input vector X is mapped to the "invalid value" 0 or to a corresponding unique address A.

The slave address generator 6 may be arranged by combining logic gates or using a LUT cascade logic network.

An output value of the unique address detector 5 and an output value of the slave address generator 6 are applied to the output combiner 7. When one or both of these output values are values other than the "invalid value" 0, the output combiner 7 produces the values as the unique address A. When both of them are the "invalid values" 0, the output combiner 7 produces the "invalid values" 0.

Note that, in FIG. 4, a master address generator 8 is composed of the hash network 2, the tentative address generator 3, the data regenerator 4, and the unique address detector 5.

Figure 5:
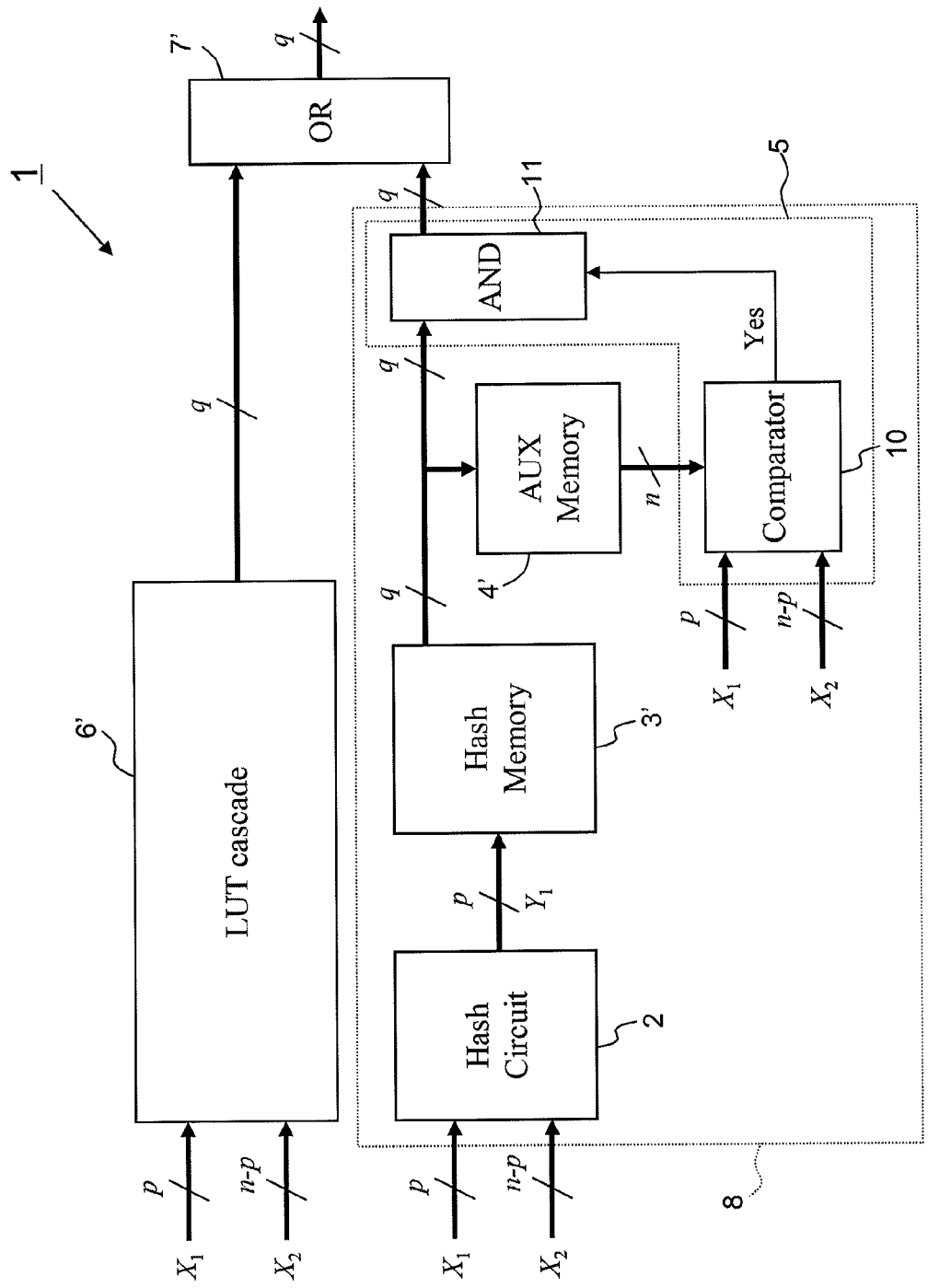
FIG. 5 is a block diagram showing a specific hardware configuration of the address generator 1 of FIG. 4.

FIG. 5 is a block diagram showing a specific hardware configuration of the address generator 1 of FIG. 4. The components corresponding to those of FIG. 4 are denoted by the same reference numerals. In FIG. 5, the tentative address generator 3 is composed of a hash memory 3'. The data regenerator 4 is composed of an auxiliary memory 4'. The unique address detector 5 is composed of a comparison circuit 10 and an AND circuit 11. The slave address generator 6 is composed of a LUT cascade 6'. Further, the output combiner 7 is composed of an OR circuit 7'.

The hash memory 3' is composed of a rewritable memory. The tentative address generation function $\hat{h}(Y_1)$ shown in a formula (2a) or a formula (2b) is stored in the hash memory 3' as a LUT.

The auxiliary memory 4' is composed of a rewritable memory. A data regeneration function $f^{-1}$, which is the reverse function of the address generation function f, is stored in the auxiliary memory 4' as a LUT.

Figure 2:
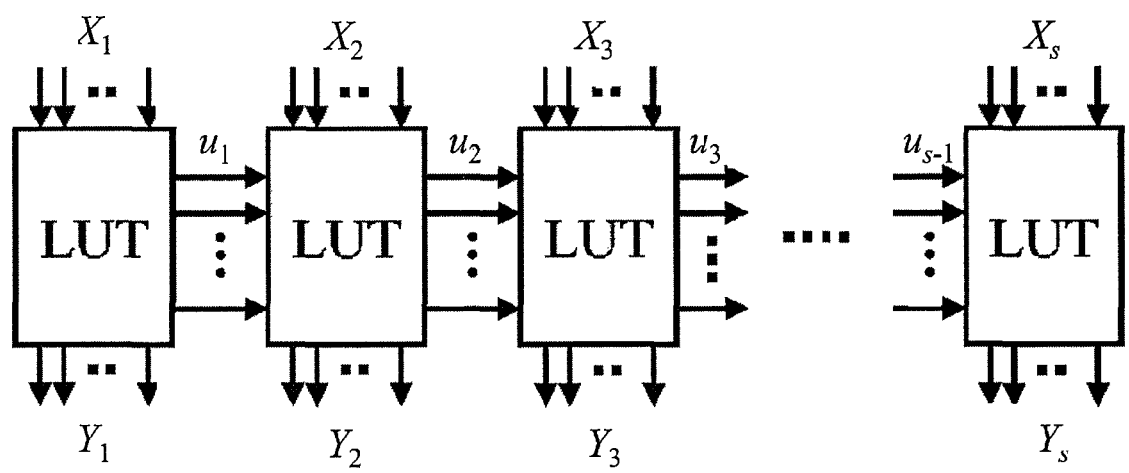
FIG. 2 is a view showing a LUT cascade having intermediate outputs.

The LUT cascade 6' is composed of a plurality of rewritable memories (cells) which are cascade-connected by a plurality of signal lines (rails) as shown in FIG. 2. A slave address generation function $f_2\hat{}(X)$ is arranged in the LUT cascade 6' as a LUT cascade. Note that, in the embodiment, the slave address generator 6 is not limited to the LUT cascade 6' and may be composed of other reconfigurable logic network, for example, a combination of logic gates, a reconfigurable PLA, and the like.

[2] Operation of Address Generator

First, an input vector X of an n-dimensional vector is applied to the address generator 1. The hash network 2 primarily converts the input vector $X=(X_1, X_2)$ into $(Y_1, X_2)$ according to a predetermined hash function and hashes an address space. Here, $(X_1, X_2)$ is a partition of X, and X1 is a bound variable and $X_2$ is a free variable. The number of pieces of the variables of the vector X is shown by d(X). It is assumed that $d(X)=n$, $d(X_1)=d(Y_1)=p$, $d(X_2)=r=n-p$. Further, q is shown by the formula (3).

The bound variable Y1, which is generated in the hash network 2 and hashed, is applied to the hash memory 3'.

Here, a hash function is previously set to the hash network 2 by adapting to the address generation function f. A generation method of the hash function will be described later.

Figure 3:
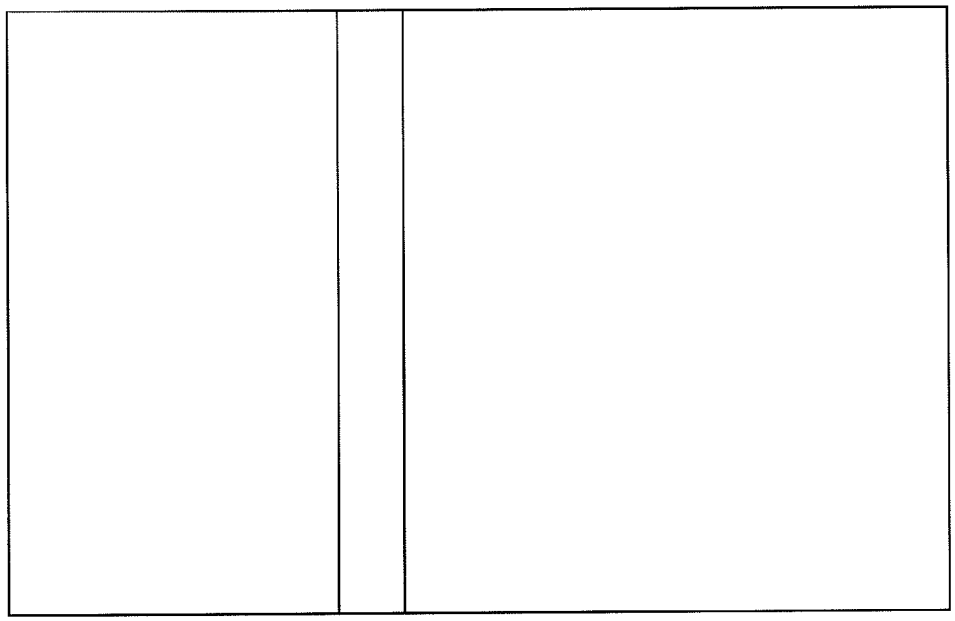
FIG. 3 is a conceptual view showing a degradation table of a hashed function f^(Y₁, X₂).

The address generation function after it is hashed is shown as $\hat{f}(Y_1, X_2)$. The degradation table of the function $\hat{f}(Y_1, X_2)$ is as shown in FIG. 3. The non-zero elements in the degradation table are dispersed by the hashing in the hash network 2. Further, it is assumed that the weight k of the address generation function f is made sufficiently smaller than 2n and that $2^p$ in the number of pieces p of the bound variable $X_1$ is larger than k. When the non-zero elements are uniformly dispersed by the hashing, almost all the columns of the degradation table of FIG. 3 have one non-zero element at the highest.

The hash memory 3' generates the tentative address A' by the tentative address generation function $\hat{h}(Y_1)$ defined by the formula (2a) or the formula (2b) based on the bound variable $Y_1$. Here, $d(A')=q$. Note that since the value of A is predicted only by the value of the $Y_1$, $A'=\hat{h}(Y_1)$ may take a value different from a correct value $A=\hat{f}(Y_1, X_2)$.

The tentative address A' is applied to the auxiliary memory 4' and the AND circuit 11.

The auxiliary memory 4' generates a regenerated vector $X''=f^{-1}(A')$ that corresponds to the tentative address A'. The regenerated vector X" and the original input vector X are applied to the comparison circuit 10.

The comparison circuit 10 compares both of them with each other, and when both of them coincide with each other, 1 is produced to the AND circuit 11, and otherwise 0 is produced thereto. The AND circuit 11 performs an AND operation of an output value of the comparison circuit 10 and the respective bits of the tentative address A'. A result of calculation is produced to the OR circuit 7'.

With this operation, when the tentative address A' is equal to the correct unique address A to X, the tentative address A' is produced from the AND circuit 11 to the OR circuit 7', and otherwise the "invalid value" 0 is produced. That is, the output value of the AND circuit 11 is made to a function in which the elements other than a minimum non-zero element is replaced with 0 as to the columns in which two or more non-zero elements exist in the degradation table of the address generation function $f_1\hat{}(Y_1, X_2)$ after hashing. Hereinafter, the function is called a master address generation function and shown by $f_1\hat{}(Y_1, X_2)$.

In contrast, the input vector X is applied also to the LUT cascade 6'. In the LUT cascade 6', a slave address generation function $f_2(X_1, X_2)$ is calculated by a LUT cascade, and a result of the calculation is produced to the OR circuit 7' as a slave address A".

Note that the slave address generation function $f_2(X_1, X_2)$ can be obtained by subjecting the address generation function $\hat{f}(Y_1, X_2)$ to the functional decomposition after it is hashed as shown in the formula (5) and converting the variable $Y_1$ of $f_2\hat{}(Y_1, X_2)$ into $X_1$ by the reverse function of the hash function as described above.

[Expression 17]

$$\hat{f}(Y_1, X_2) = \hat{f}_1(Y_1, X_2) \vee \hat{f}_2(Y_1, X_2) \quad (5)$$

Accordingly, when the master address generation function $f_1\hat{}(Y_1, X_2)$ is determined, the hashed slave address generation function $f_2\hat{}(Y_1, X_2)$ is uniquely determined by the following formula (6).

[Expression 18]

$$\hat{f}_2(Y_1, X_2) = \begin{cases} \hat{f}(Y_1, X_2) & (\text{if } \hat{f}_1(Y_1, X_2) = 0), \\ 0 & (\text{otherwise}). \end{cases} \quad (6)$$

Note that a specific method of arranging the slave address generation function $f_2(X_1, X_2)$ will be described later.

The master address generation function $f_1\hat{}(Y_1, X_2)$ and the slave address generation function $f_2(X_1, X_2)$ are complementary to the address generation function $f(X_1, X_2)$. That is, a formula (7) is established from the formula (5).

[Expression 19]

$$f(X_1, X_2) = \hat{f}(Y_1, X_2) \vee f_2(X_1, X_2) \quad (7)$$

Thus, the OR circuit 7' calculates the value of the address generation function $f(X_1, X_2)$ by performing an OR operation of the output value $f_1\hat{}(Y_1, X_2)$ of the AND circuit 11 and the output value $f_2(X_1, X_2)$ of the LUT cascade 6'.

[3] Method of Arranging Hash Function

In the hash network 2, any function can be used as a hash function for hashing the bound variable $X_1$ as long as it uniformly distributes the non-zero elements in the degradation table of the address generation function f. Here, the following hash function is used as an example in consideration of easiness of realization.

[Expression 20]

$$Y_1 = (y_1, y_2, \ldots, y_p), y_i = x_i \oplus x_j \, (x_i \in \{X_1\}, y_i \in \{Y_1\}, x_j \in \{X_2\}) \quad (8)$$

[3-1] Generation Algorithm of Hash Function

In the address generation function $f(X_1, X_2)$, a bound variable is shown by $X_1=(x_1, x_2, \ldots, x_p)$, and a free variable is shown by $X_2=(x_{p+1}, x_{p+2}, \ldots, x_n)$. A function, which is obtained by replacing the bound variable $X_1$ to $Y_1=(y_1, y_2 \ldots, y_p)$, is shown by $f\hat{\ }(Y_1, X_2)$. In the columns of a degradation table of the function $f\hat{\ }(Y_1, X_2)$, the number of pieces of the columns including a non-zero element is shown by w. To store many addresses in the hash memory 3', it is sufficient to select $Y_1$ by which w is maximized. $Y_1$ may be selected using various known algorithms (non-linear program method and heuristic algorithm).

[Algorithm 1]

When Expression 21 is established to the respective elements $x_i$ (i=1, 2, \ldots p) of $X_1$, $X_{j1}' \in \{X_2\}$ by which w is maximized is selected.

$$y_i = x_i \oplus x'_{j_i} \quad \text{[Expression 21]}$$

The operation is repeated until w does not increase.
(End of Algorithm)

The hash function is arranged by $X_j=(x_{j1}, x_{j2}, \ldots, x_{jp})$ determined as described above.

[3-2] Realization Method of Hash Function

In the address generation function $f(X_1, X_2)$ having the weight k, the function, which is obtained by replacing the bound variable $X_1=(x_1, x_2 \ldots, x_p)$ with Expression 22, is shown by a function $f\hat{\ }(Y_1, X_2)$.

[Expression 22]

$$(y_1 \oplus x_{j1}, y_2 \oplus x_{j2}, \ldots, y_p \oplus x_{j_p}) \quad (9)$$

Here, it is assumed that the number of pieces p of the bound variable satisfies the condition of the following formula (10).

[Expression 23]

$$p \geq \lceil \log_2(k+1) \rceil \quad (10)$$

When $f\hat{\ }(a, X_2)$ has two or more non-zero output values to a p-dimensional binary vector a ($\in Y_1$), the function, which is obtained by replacing the values of $f\hat{\ }(a, X_2)$ other than a minimum non-zero output value with 0, is shown by the master address generation function $f_1\hat{\ }(Y_1, X_2)$. The master address generation function $f_1\hat{\ }(Y_1, X_2)$ is shown by the following formula (11).

[Expression 24]

$$\hat{f}_1(Y_1, X_2) = \begin{cases} \hat{f}(Y_1, X_2) & \left(\text{if } \hat{f}(Y_1, X_2) = \min_{b \in B^{(n-p)}, \hat{f} \neq 0} \hat{f}(Y_1, b)\right) \\ 0 & (\text{otherwise}) \end{cases} \quad (11)$$

Next, a function $f_2(Y_1, X_2)$ is determined by the formula (6). At the time, the relation of the formula (7) is established.

In the respective columns of the degradation table of the master address generation function $f_1\hat{\ }(Y_1, X_2)$, only one non-zero output value exists at the highest. Next, the function $h\hat{\ }(Y_1)$ defined by the following formula (12) is realized by the hash memory 3'.

[Expression 25]

$$\hat{h}(Y_1) = \max_{b \in B^{n-p}} \hat{f}_1(Y_1, b) \quad (12)$$

However, since there is a possibility that the value of the function $h\hat{\ }(Y_1)$ is different from the value of the master address generation function $f_1\hat{\ }(Y_1, X_2)$, whether or not an output value is correct is confirmed using the auxiliary memory 4'. Further, the slave address generation function $f_2(Y_1, X_2)$ is generated by performing replacement of the following formula (13) from the function $f_2\hat{\ }(Y_1, X_2)$. The slave address generation function $f_2(Y_1, X_2)$ is realized by the LUT cascade 6'.

[Expression 26]

$$x_i = y_i \oplus x_{j_i} \quad (13)$$

EXAMPLE 5

(Table 4) shows the degradation table of the address generation function $f(X_1, X_2)$ of six variables having the weight k=7. The degradation table of the function $f\hat{\ }(Y_1, X_2)$, which is obtained by replacing the bound variable $X_1=(x_1, x_2, x_3)$ to Y1 by the function as shown in the next formula (14) and hashed, is shown in (Table 5).

[Expression 27]

$$Y_1 = (y_1, y_2, y_3) = (x_1 \oplus x_6, x_2 \oplus x_5, x_3 \oplus x_4) \quad (14)$$

In the hashed function, the columns of the original function are replaced. Further, each row employs a different replacement method. In the original function, two non-zero elements exist in the columns of $(x_1, X_2, x_3)=(0, 0, 0), (0, 1, 0), (0, 0, 1)$. In contrast, in the function $f\hat{\ }(X_1, X_2)$ shown in (Table 5) after it is hashed, two non-zero elements exist only in the columns of $(y_1, y_2, y_3)=(0, 1, 0)$. The degradation table of the function $f1\hat{\ }(Y_1, X_2)$, in which the non-zero element 4 that is larger one of the two non-zero elements is replaced with 0, is shown in (Table 6). Further, (Table 7) shows the degradation table of the function $f_2\hat{\ }(Y_1, X_2)$ which is to be realized by the LUT cascade 6'. In the example, only one non-zero element exists. The remaining functions are realized by the hash memory 3' shown in (Table 8) and the auxiliary memory 4' of (Table 9). Since the output $h\hat{\ }(Y_1)$ of the hash memory 3' predicts the value of the function $f_1\hat{\ }$ using only the value of $(y_1, y_2, y_3)$, there is a possibility that the value is different from $f1\hat{\ }$. Accordingly, whether or not the output is correct is checked using the auxiliary memory 4' shown in (Table 9). The function to be realized by the LUT cascade 6' takes a non-zero output value 4. A combination in the input thereof is $(x_1, x_2, x_3, x_4, x_5, x_6)=(0, 0, 1, 0, 1, 1)$.

Figure 6:
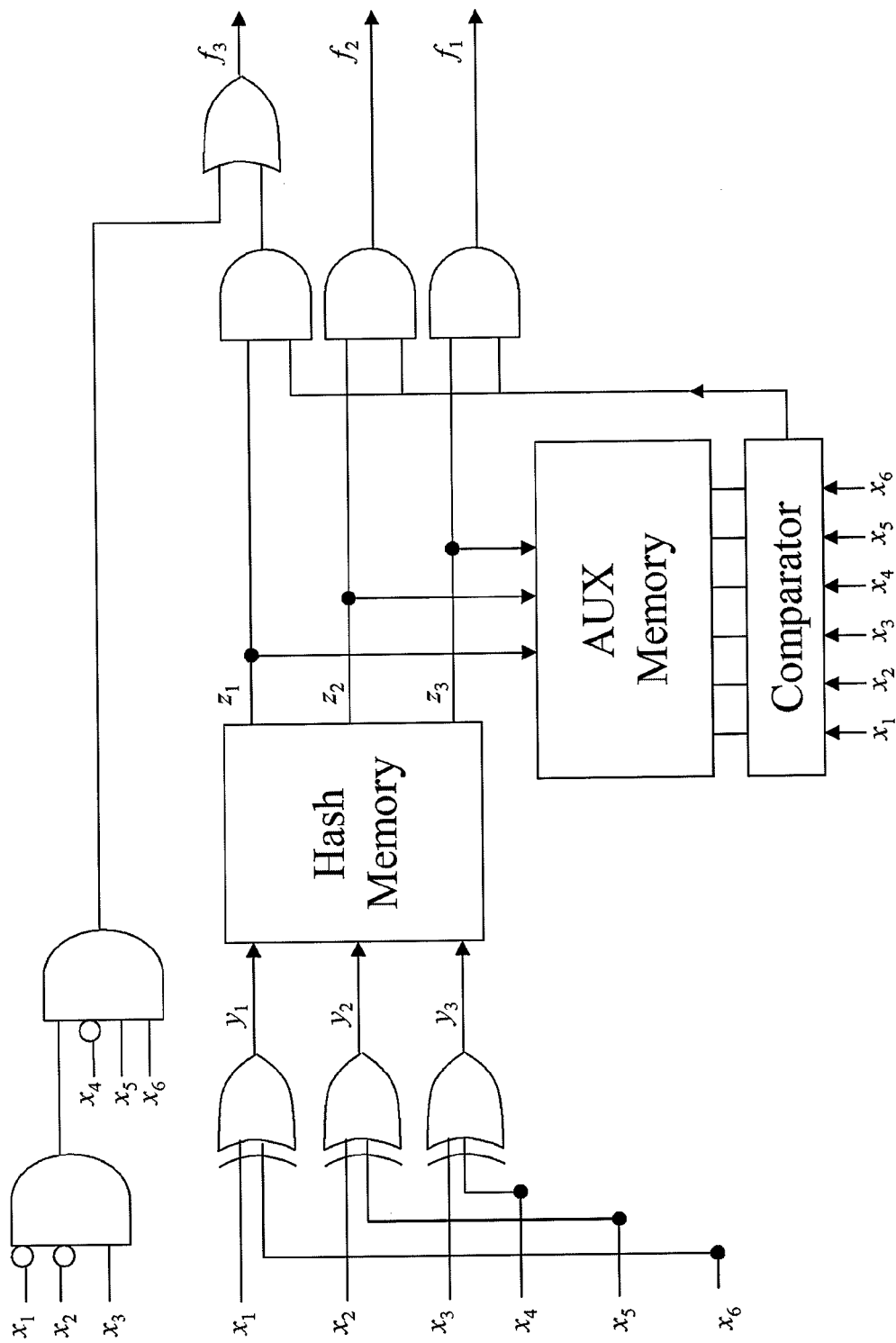
FIG. 6 is a view showing an example in which six variable functions are realized by a hash memory.

FIG. 6 shows an overall view of a circuit for realizing the function f by the method. The portion of the LUT cascade 6' is realized by a cascade of AND gates. Further, although the non-zero output is 4, since it is (1, 0, 0) when it is shown by a binary digit, the OR circuit 7' performs an OR operation of the most significant output bit of the output bits of the AND circuit 11 and the output of a cascade.

(End of example)

TABLE 4

Degradation Table of Function $f(X_1, X_2)$

|  | 0 | 0 | 0 | 0 | 1 | 1 | 1 | 1 | $x_3$ |
|---|---|---|---|---|---|---|---|---|---|
|  | 0 | 0 | 1 | 1 | 0 | 0 | 1 | 1 | $x_2$ |
|  | 0 | 1 | 0 | 1 | 0 | 1 | 0 | 1 | $x_1$ |
| 000 | 0 | 0 | 0 | 0 | 0 | 0 | 0 | 0 |  |
| 001 | 0 | 0 | 0 | 0 | 0 | 0 | 0 | 0 |  |
| 010 | 1 | 0 | 2 | 0 | 3 | 0 | 0 | 0 |  |
| 011 | 0 | 0 | 0 | 0 | 4 | 0 | 0 | 0 |  |
| 100 | 5 | 0 | 0 | 0 | 0 | 0 | 0 | 0 |  |
| 101 | 0 | 0 | 0 | 0 | 0 | 0 | 0 | 0 |  |
| 110 | 0 | 0 | 0 | 0 | 0 | 0 | 0 | 6 |  |
| 111 | 0 | 0 | 7 | 0 | 0 | 0 | 0 | 0 |  |
| $x_6 x_5 x_4$ |  |  |  |  |  |  |  |  |  |

TABLE 5

Degradation Table of Function $\hat{f}(Y_1, Y_2)$ after Hashing

|  | 0 | 0 | 0 | 0 | 1 | 1 | 1 | 1 | $y_3$ |
|  | 0 | 0 | 1 | 1 | 0 | 0 | 1 | 1 | $y_2$ |
|  | 0 | 1 | 0 | 1 | 0 | 1 | 0 | 1 | $y_1$ |
| 000 | 0 | 0 | 0 | 0 | 0 | 0 | 0 | 0 | |
| 001 | 0 | 0 | 0 | 0 | 0 | 0 | 0 | 0 | |
| 010 | 2 | 0 | 1 | 0 | 0 | 0 | 3 | 0 | |
| 011 | 0 | 0 | 4 | 0 | 0 | 0 | 0 | 0 | |
| 100 | 0 | 5 | 0 | 0 | 0 | 0 | 0 | 0 | |
| 101 | 0 | 0 | 0 | 0 | 0 | 0 | 0 | 0 | |
| 110 | 0 | 0 | 0 | 0 | 6 | 0 | 0 | 0 | |
| 111 | 0 | 0 | 0 | 0 | 0 | 7 | 0 | 0 | |
| $x_6x_5x_4$ | | | | | | | | | |

TABLE 6

Degradation Table of Function $\hat{f}_1(Y_1, X_2)$

|  | 0 | 0 | 0 | 0 | 1 | 1 | 1 | 1 | $y_3$ |
|  | 0 | 0 | 1 | 1 | 0 | 0 | 1 | 1 | $y_2$ |
|  | 0 | 1 | 0 | 1 | 0 | 1 | 0 | 1 | $y_1$ |
| 000 | 0 | 0 | 0 | 0 | 0 | 0 | 0 | 0 | |
| 001 | 0 | 0 | 0 | 0 | 0 | 0 | 0 | 0 | |
| 010 | 2 | 0 | 1 | 0 | 0 | 0 | 3 | 0 | |
| 011 | 0 | 0 | 0 | 0 | 0 | 0 | 0 | 0 | |
| 100 | 0 | 5 | 0 | 0 | 0 | 0 | 0 | 0 | |
| 101 | 0 | 0 | 0 | 0 | 0 | 0 | 0 | 0 | |
| 110 | 0 | 0 | 0 | 0 | 6 | 0 | 0 | 0 | |
| 111 | 0 | 0 | 0 | 0 | 0 | 7 | 0 | 0 | |
| $x_6x_5x_4$ | | | | | | | | | |

TABLE 7

Degradation Table of Function $\hat{f}_2(Y_1, X_2)$

|  | 0 | 0 | 0 | 0 | 1 | 1 | 1 | 1 | $y_3$ |
|  | 0 | 0 | 1 | 1 | 0 | 0 | 1 | 1 | $y_2$ |
|  | 0 | 1 | 0 | 1 | 0 | 1 | 0 | 1 | $y_1$ |
| 000 | 0 | 0 | 0 | 0 | 0 | 0 | 0 | 0 | |
| 001 | 0 | 0 | 0 | 0 | 0 | 0 | 0 | 0 | |
| 010 | 0 | 0 | 0 | 0 | 0 | 0 | 0 | 0 | |
| 011 | 0 | 0 | 4 | 0 | 0 | 0 | 0 | 0 | |
| 100 | 0 | 0 | 0 | 0 | 0 | 0 | 0 | 0 | |
| 101 | 0 | 0 | 0 | 0 | 0 | 0 | 0 | 0 | |
| 110 | 0 | 0 | 0 | 0 | 0 | 0 | 0 | 0 | |
| 111 | 0 | 0 | 0 | 0 | 0 | 0 | 0 | 0 | |
| $x_6x_5x_4$ | | | | | | | | | |

TABLE 8

Function $\hat{h}(Y_1)$ Realized by Hash Memory

| $y_3$ | 0 | 0 | 0 | 0 | 1 | 1 | 1 | 1 |
| $y_2$ | 0 | 0 | 1 | 1 | 0 | 0 | 1 | 1 |
| $y_1$ | 0 | 1 | 0 | 1 | 0 | 1 | 0 | 1 |
| $\hat{h}(Y_1)$ | 2 | 5 | 1 | 0 | 6 | 7 | 3 | 0 |

TABLE 9

Contents of Auxiliary Memory

| $z_1z_2z_3$ | $x_1$ | $x_2$ | $x_3$ | $x_4$ | $x_5$ | $x_6$ |
|---|---|---|---|---|---|---|
| 000 | 0 | 0 | 0 | 0 | 0 | 0 |
| 001 | 0 | 0 | 0 | 0 | 1 | 0 |
| 010 | 0 | 1 | 0 | 0 | 1 | 0 |
| 011 | 0 | 0 | 1 | 0 | 1 | 0 |
| 100 | 0 | 0 | 0 | 0 | 0 | 0 |
| 101 | 0 | 0 | 0 | 0 | 0 | 1 |
| 110 | 1 | 1 | 1 | 0 | 1 | 1 |
| 111 | 0 | 1 | 0 | 1 | 1 | 1 |

Note that when a formula (8) is used as the hash function, the comparison potion of the output of the portion of $X_1$ of the auxiliary memory 4' and $X_1$ in the comparison circuit 10 can be omitted. A reason is as shown below.

A function to be realized in the hash memory 3' is $\hat{h}(Y_1)$. Although the value of the auxiliary memory 4' is referred to by the output value, the elements of rows of the original address generation function f are replaced in the degradation table of the hashed address generation function f^. Accordingly, it is sufficient to examine the value of $X_2$ to confirm that the output value of the hash memory 3' is correct. That is, when the output value of the auxiliary memory 4' coincides with the value of $X_2$, it is guaranteed that the value of $X_1$ is also in coincidence therewith from the relation of the formula (8). Accordingly, it can be found that the output of the hash memory 3' is correct. Further, when they do not coincide with each other, the output value of the comparison circuit 10 is 0.

In, for example, the circuit of FIG. 6, $(x_4, x_5, x_6)$ is sufficient as the output of the auxiliary memory 4', and $(x_1, x_2, x_3)$ can be omitted in the input of the comparison circuit 10.

[4] Ratio of Registered Vectors that can be Realized by Hash Memory

Next, to evaluate to what degree a circuit scale can be reduced in the address generator according to the present invention, the ratio of the registered vectors, which can be realized by the tentative address generator 3 (the hash memory 3'), is evaluated.

First, the following theorem is established as to the ratio of the registered vectors that can be realized by the tentative address generator 3.

[Theorem 4]

It is assumed that f is an n-input address generation function having the weight k and that non-zero elements are uniformly distributed in a degradation table. At the time, the ratio δ of the addresses that can be realized by the tentative address generator 3 in FIG. 4 is shown by the following formula ( ) Here, P=|$Y_1$| shows the number of pieces of the bound variables of the degradation table of f^($Y_1, X_2$).

[Expression 28]

$$\delta \simeq 1 - \frac{1}{2}\left(\frac{k}{2^p}\right) \mid \frac{1}{6}\left(\frac{k}{2^p}\right)^2 \tag{15}$$

(End of Theorem)
(Certification)

k shows the total number of the non-zero elements in the degradation table. $\alpha = k/2^n$ shows the ratio of the non-zero elements in the degradation table. $\beta = 1-\alpha$ shows the ratio of the zero elements in the degradation table. $r = n-p = |X_2|$ shows the number of pieces of the free variables of the degradation table of f^($Y_1, X_2$). At the time, a probability P0 that all the elements in a certain column become 0 and a probability P1 that at least one non-zero element is included in the elements of a certain column are shown by the following formulas (16) and (17).

[Expression 29]

$$P_0 = \beta^{2^r} \tag{16}$$

$$P_1 = 1 - \beta^{2^r} \tag{17}$$

$2^p$ pieces of columns exist as a whole, and the number of non-zero elements is k. As to a column in which two or more non-zero elements exist, when it is assumed that only one non-zero element is realized by the tentative address generator 3, the ratio δ of the addresses that can be expressed by the tentative address generator 3 is shown by a formula (18).

[Expression 30]

$$\delta = (1-\beta^{2r}) \cdot \frac{2^p}{k} \qquad (18)$$
$$= (1-(1-\alpha)^{2r}) \cdot \frac{2^p}{k}$$
$$= \left(1 - \left(\sum_{i=0}^{2r}(-1)^i\binom{2^r}{i}\alpha^i\right)\right) \cdot \frac{2^p}{k}$$
$$= \left(\sum_{i=1}^{2r}(-1)^{i+1}\binom{2^r}{i}\alpha^i\right) \cdot \frac{2^p}{k}$$

Further, s=n−q results in r−s=q−p from a relation r=n−p. Since s>r, the absolute values of the respective terms of the above formulas degrease as i increases. Next, when δ is approximated using up to a third term of the final formula on the right-hand side of the formula (18), it is shown by a formula (19).

[Expression 31]

$$\delta \simeq \left[2^r\alpha - \frac{2^{2r}\alpha^2}{2} + \frac{2^{3r}\alpha^3}{6}\right] \cdot \frac{2^p}{k} \qquad (19)$$
$$\simeq \left[2^r\left(\frac{k}{2^n}\right) - \frac{1}{2}2^{2r}\left(\frac{k}{2^n}\right)^2 + \frac{1}{6}2^{3r}\left(\frac{k}{2^n}\right)^3\right] \cdot \frac{2^p}{k}$$
$$\simeq 1 - \frac{1}{2}\left(\frac{k}{2^p}\right) + \frac{1}{6}\left(\frac{k}{2^p}\right)^2$$

(End of certification)

When it is assumed, for example, $k/2^p=\frac{1}{4}$, $\delta \approx 0.8854$. Further, in the region of $\frac{1}{4} \leq k/2^p \leq \frac{1}{2}$, δ becomes a monotone decreasing function of $k/2^p$.

EXAMPLE 6

A case of n=40, k=1730 will be examined. At the time, since Expression 32 is established, the number of pieces of the variables of the bound variable is set to p=13.

$$q=\lceil log_2(k|1)\rceil = \lceil log_2(1730|1)\rceil = 11 \qquad [\text{Expression 32}]$$

(1) When Realized Only by LUT Cascade

When the number of inputs of cells is set to p=13, the number of stages of a cascade is as shown in Expression 33 from (Theorem 2).

[Expression 33]

$$\left\lceil\frac{n-q}{p-q}\right\rceil = \left\lceil\frac{40-11}{13-11}\right\rceil = \left\lceil\frac{29}{2}\right\rceil = 15$$

The amount of a memory per cell is $2^p \times q = 2^{13} \times 11$ bits. Accordingly, the total amount of the memory is $2^{13} \times 11 \times 15 = 1{,}351{,}680$ bits.

(2) When Realized by Address Generator 1 of Present Invention

Since s=n−q=40−11=29, r=n−p=40−13=27, the assumption of the approximation of (Theorem 4) is established. Expression 34 is established from (Theorem 4).

[Expression 34]

$$\delta \simeq 1 - \frac{1}{2}\left(\frac{k}{2^p}\right) + \frac{1}{6}\left(\frac{k}{2^p}\right)^2 \qquad (20)$$
$$= 1 - \frac{1}{2}\left(\frac{1730}{2^{13}}\right) + \frac{1}{6}\left(\frac{1730}{2^{13}}\right)^2$$
$$\simeq 0.901$$

The hash memory 3' has p=13 input q=11 output, and the auxiliary memory 4' has q=11 input n=40 output. The LUT cascade 6' realizes an address generation function having a weight of 1730×(1−0.901)=170. At the time, the number of outputs of the cells of a LUT cascade is as shown in Expression 35.

$$\lceil log_2(170+1)\rceil = 8 \qquad [\text{Expression 35}]$$

When the number of inputs of the cells is 10, the number of stages of the LUT cascade to be realized is as shown in Expression 36.

[Expression 36]

$$\left\lceil\frac{n-q}{p-q}\right\rceil = \left\lceil\frac{40-8}{10-8}\right\rceil = \left\lceil\frac{32}{2}\right\rceil = 16$$

The amount of the memory per cell in the stages other than a final stage is $2^{10} \times 8$ bits at the highest. The amount of the memory of the cell of the final stage is $2^{10} \times 11$ bits at the highest. The total amount of the memory of the cascade is $2^{10} \times 8 \times 15 + 2^{10} \times 11 = 134{,}144$ bits. The capacity of the hash memory 3' is $2^{13} \times 11 = 901112$ bits. The capacity of the auxiliary memory 4' is $2^{11} \times 40 = 81920$ bits. Accordingly, the total amount of the memory is 306,176 bits.

Thus, in the example, when the address generator 1 of the present invention is used, the total amount of the memory is preferably more reduced than when the address generation function is arranged only by the LUT cascade.

(End of example)

[5] Result of Experiment

As an example of application of the address generation circuit 1, a table of frequently-used English words will be examined. Here, three types of word tables (word table 1, word table 2, word table 3) were used as benchmarks. Although the number of characters of a word in the word notebook is 13 characters at the maximum, only initial eight characters are treated. Further, a word shorter than eight characters was made to eight characters by adding spaces to the end thereof. When each English character is expressed by five bits, each English word can be expressed by 40 bits. Further, the number of words in the word table 1, the word table 2, and the word table 3 is 1730 words, 3366 words, and 4705 words, respectively. In the respective tables, a unique index (natural number) is added to each word. At the time, the indexes of the words are 11 bits, 12 bits, and 13 bits, respectively.

Next, a hash function is generated. The number of inputs of the hash function is set to (the number of bits of the indexes of the word notebook)+2. In the word table 1, the number of the words is k=1730, the number of bits of the indexes is as shown in Expression 37, and the number of pieces of a bound variable is p=q+2=13.

[Expression 37]

$$q=\lceil log_2(1+k)\rceil = \lceil log_2(1+1730)\rceil = 11 \qquad (21)$$

The number of pieces of the columns of a degradation table is $2^9=2^{13}=8192$. The number of the columns including one non-zero element is 1389. The number of the columns including two or more non-zero elements is 165. The number of registered vectors that can not be realized by the hash memory 3' is 176. That is, 90% of all the words can be realized by the hash memory 3' and it is necessary to realize the remaining 10% by the LUT cascade. A result of the experiment is shown in (Table 10).

TABLE 10

Realization of English Word Table

|  | Word table 1 | Word table 2 | Word table 3 |
|---|---|---|---|
| Number of words: k | 1730 | 3366 | 4705 |
| Number of inputs: n | 40 | 40 | 40 |
| Number of outputs: q | 11 | 12 | 13 |
| Number of inputs of hash function: p | 13 | 14 | 15 |
| Number of columns in which one non-zero elements exists | 1389 | 2752 | 4000 |
| Number of columns in which two or more non-zero elements exist | 165 | 293 | 342 |
| Number of words that cannot be realized by hash memory | 176 | 321 | 363 |

Next, a result of experiment when a similar address generation function is realized using a pseudo-random number (average of 100 pieces) is shown in (Table 11). In this case, the number of the columns including one non-zero element was 1398.4, the number of the columns including two or more non-zero element was 160.0, and the number of registered vectors that could be realized by the hash memory 3' was 171.6. A similar experiment was performed also as to the word notebooks 2, 3.

TABLE 11

Realization of Address Generation Function Generated by Pseudorandom Number

|  | Function 1 | Function 2 | Function 3 |
|---|---|---|---|
| Number of words: k | 1730 | 3366 | 4705 |
| Number of inputs: n | 40 | 40 | 40 |
| Number of outputs: q | 11 | 12 | 13 |
| Number of inputs of hash function: p | 13 | 14 | 15 |
| Number of columns in which one non-zero elements exists | 1398.4 | 2737.7 | 4075.1 |
| Number of columns in which two or more non-zero elements exist | 160.0 | 302.7 | 307.0 |
| Number of words that cannot be realized by hash memory | 171.6 | 325.6 | 322.9 |
| Value determined from theorem 4 | 169.8 | 322.1 | 321.6 |

A result of actual word tables, and a result as to the address generation function generated by the pseudo-random number were not greatly different from those theoretically determined by (Theorem 4). Accordingly, it can be found that the hash function generated using the (Algorithm 1) is effective as a function for distributing non-zero elements at random.

Further, a result of comparison of the necessary amount of a memory is shown in (Table 12). As apparent from (Table 12), the necessary total amount of the memory is greatly smaller than the case that the address generation function is realized by one LUT cascade.

TABLE 12

Comparison of Amount of Memory (English Word Notebook)

|  |  | Word table 1 | Word table 2 | Word table 3 |
|---|---|---|---|---|
| Realized by one cascade |  |  |  |  |
| Number of inputs | n | 40 | 40 | 40 |
| Number of outputs | q | 11 | 12 | 13 |
| Number of inputs of cell | p | 13 | 14 | 15 |
| Number of stages | s | 15 | 14 | 14 |
| Amount of memory | $sq2^p$ | 1,351,680 | 2,752,512 | 5,963,776 |
| Realized by has memory and cascade |  |  |  |  |
| Amount of hash memory | $q2^p$ | 90,112 | 196,608 | 425,984 |
| Amount of Auxiliary memory | $n2^q$ | 81,920 | 163,840 | 327,680 |
| Amount of memory of cascade |  | 134,144 | 301,056 | 304,104 |
| Total |  | 306,176 | 661,504 | 1,056,768 |

[Embodiment 2]

In the embodiment, a case that two master address generators are used (super hybrid method) will be explained.

Figure 7:
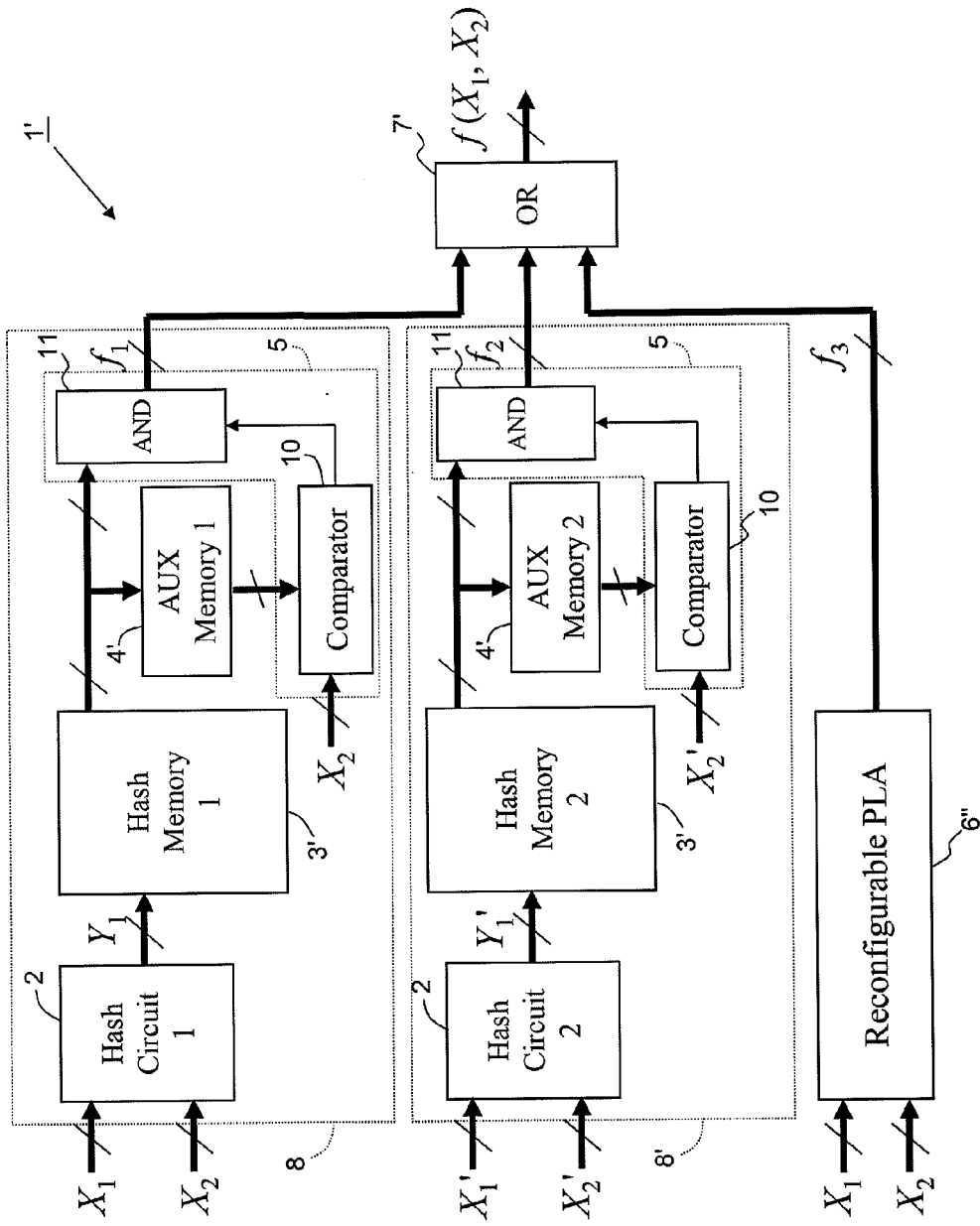
FIG. 7 is a block diagram showing a hardware configuration of the address generator according to an embodiment 1 of the present invention.

FIG. 7 is a block diagram showing a hardware configuration of an address generator according to an embodiment 1 of the present invention. In FIG. 7, the same components as those of FIG. 5 are denoted by the same reference numerals.

In comparison with FIG. 5, the embodiment is different from the embodiment 1 in that an address generator 1' of the embodiment has two master address generators 8, 8', whereas the address generator 1 of the embodiment 1 has the one master address generator 8.

The master address generator 8 calculates a master address generation function $f^{\frown}_1(Y_1, X_2)$ as to a partition $(X_1, X_2)$ to an input vector X. Here, $Y_1$ is a vector obtained by hashing $X_1$ and calculated likewise the formula (8). Further, the master address generator 8' calculates a master address generation function $f^{\frown}_1{}'(Y_1', X_2')$ as to a partition $(X_1', X_2')$ to an input vector X. Here, $Y_1'$ is a vector obtained by hashing $X_1'$ and calculated likewise the formula (8).

Here, the partition $(X_1, X_2)$ is different from the partition $(X_1', X_2')$. Specifically, it is sufficient to determine the optimum partition $(X_1', X_2')$ by the following procedure.

(1) To an address generation function f:

(1-1) Variables are sequentially partitioned so that the number of inputs of a first hash memory is (q+1), the number of outputs thereof is q, the number of inputs of a first auxiliary memory is q, and the number of outputs thereof is (n−q−1); and (1-2) A hash function is determined so that the non-zero elements of a degradation table are dispersed as much as possible. The function, which is expressed by a unique address realized by the configuration, is shown by $f^{\frown}_{11}$ (in a random function, about 80% of original unique addresses can be expressed).

(2) To the function, which is expressed by a unique address that is not realized by the above operation, that is, to f−$f^{\frown}_{11}$:

(2-1) Variables are sequentially partitioned so that the number of inputs of a second hash memory is (q−1), the number of outputs thereof is (q−2), the number of inputs of a second auxiliary memory is (q−2), and the number of outputs thereof is (n−q+2);

(2-2) A hash function is determined so that the non-zero elements in the degradation table are dispersed as much as possible, which the function that is expressed by a unique address realized by the configuration is shown by $f^{\frown}_{12}$ (in a random function, about 16% of the original unique addresses can be expressed); and (3) The function, which is expressed by a unique address that is not realized by any of the operations, is realized by a method of a LUT cascade or a reconfigurable PLA, and the like.

As described above, since the two master address generators 8, 8' are provided, the ratio of registered vectors whose unique addresses are determined by the master address generators 8, 8' is more increased than the case of the embodiment 1. Accordingly, since the number of the registered vectors whose unique addresses are determined by a slave address generation function $f'_2(X_1, X_2)$ is reduced, the scale of the network of a slave address generator 6 (reconfigurable PLA 6") can be reduced.

EXAMPLE 7

A case that an address generation function f(X) having the weight k=1730 and the number of variables of n=40 is realized using the address generator 1' of FIG. 7 will be examined. Note that the address generator 1 of FIG. 5 will be also examined for comparison.

In this case, Expression 38 is established.

[Expression 38]

$$q = \lceil \log_2(k+1) \rceil = \lceil \log_2(1+1730) \rceil = 11 \quad (22)$$

[Reconfigurable PLA]

Figure 8:
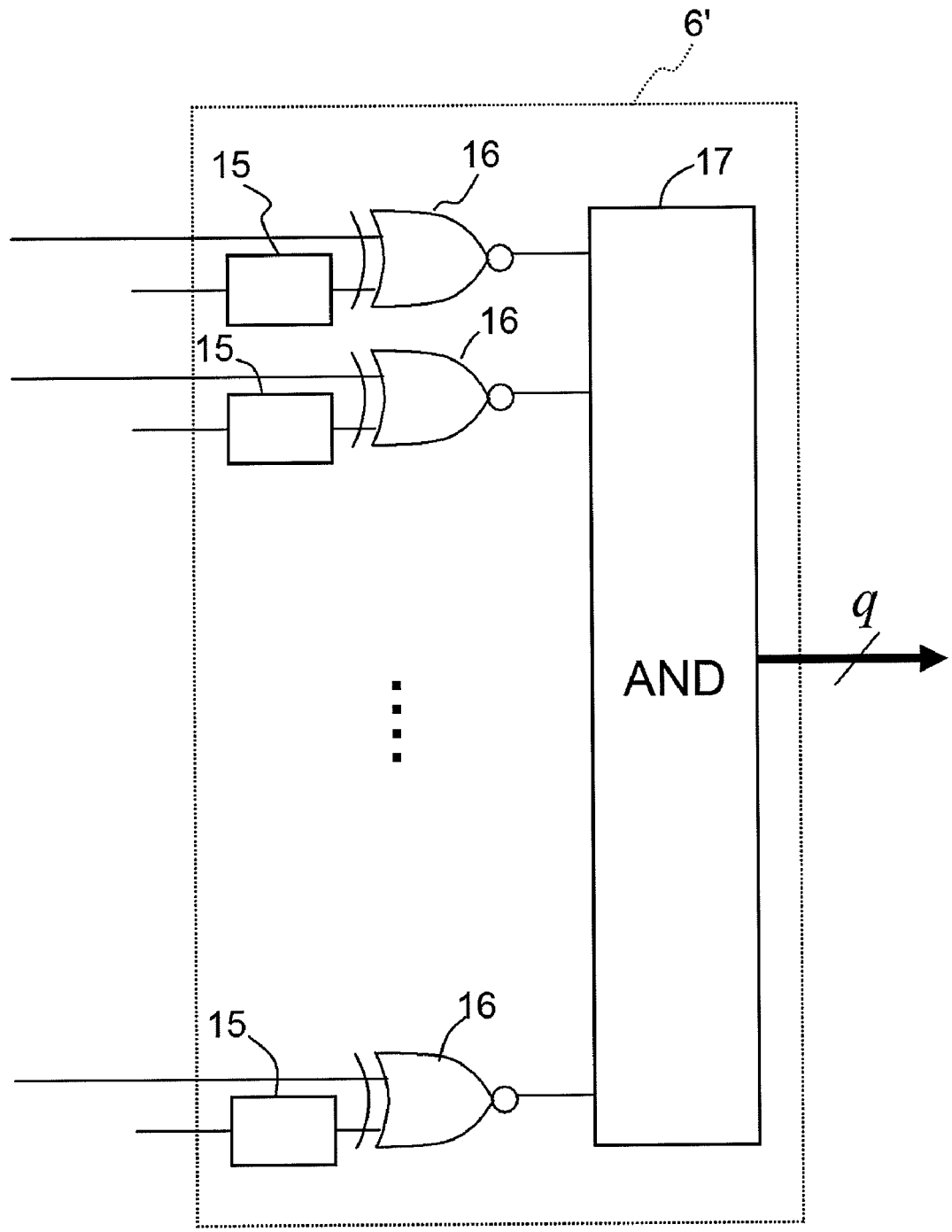
FIG. 8 is a view showing an configuration of a reconfigurable PLA 6' using registers and gates.
Figure 9:
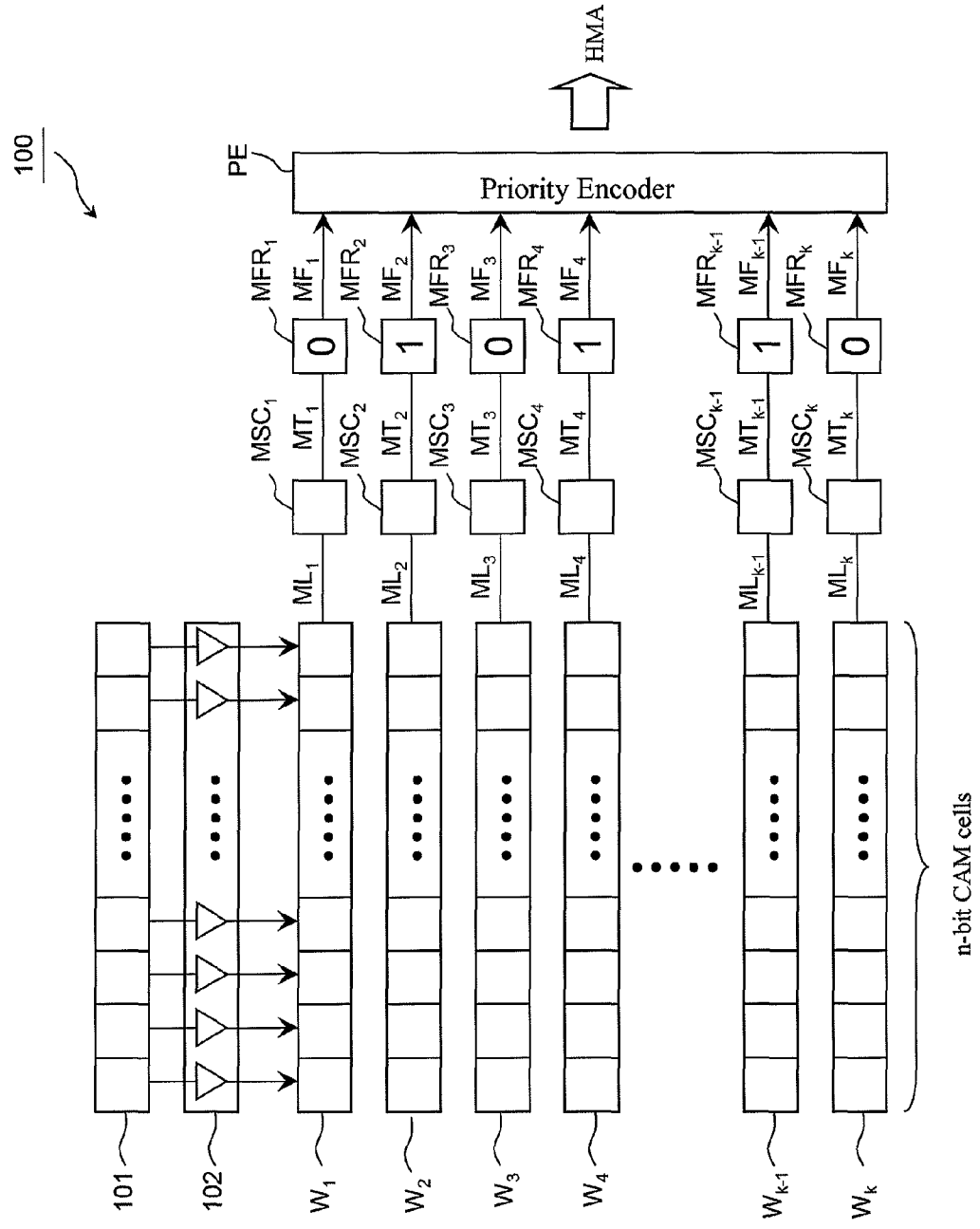
FIG. 9 is a block diagram showing an example of a basic configuration of a conventional address generator (CAM).
Figure 10:
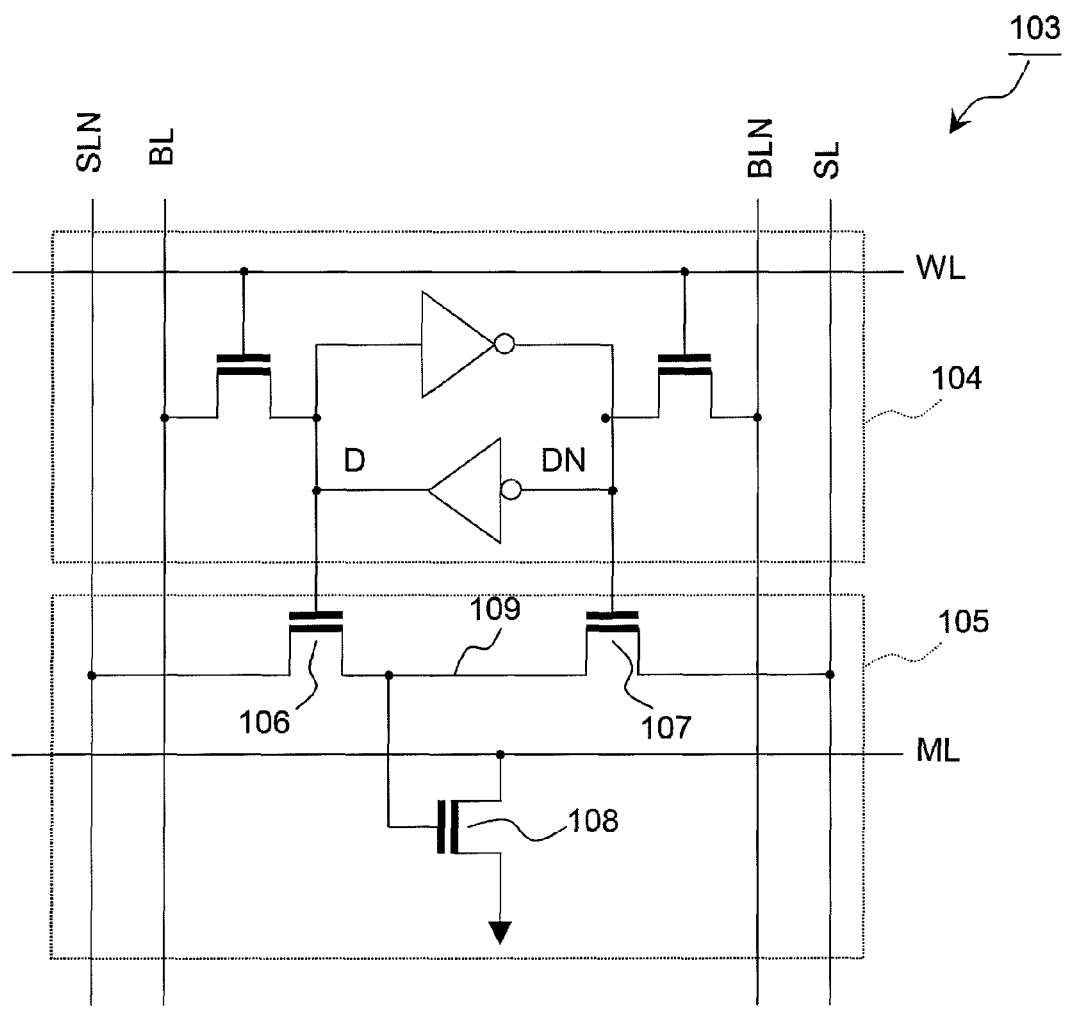
FIG. 10 is a circuit diagram showing an configuration of a CAM cell of FIG. 6.
Figure 11:
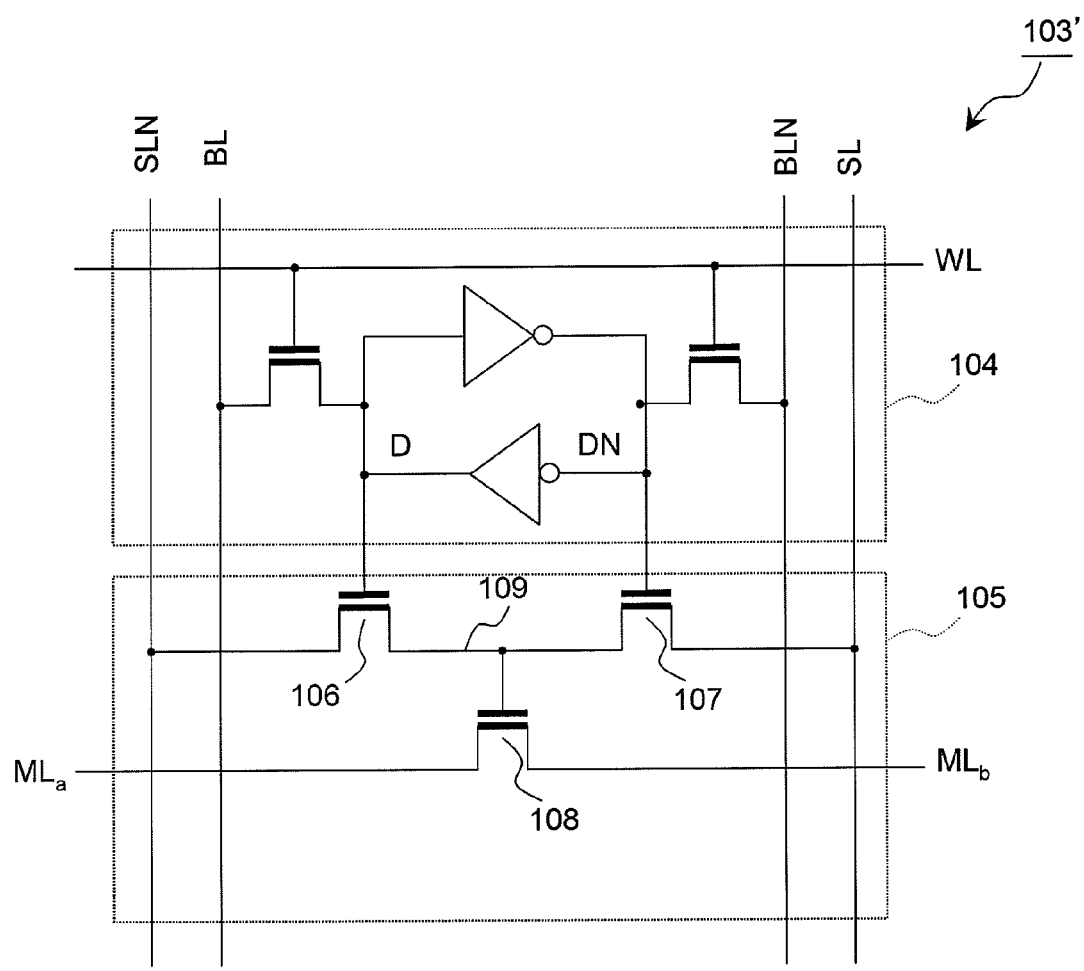
FIG. 11 is a circuit diagram of an configuration of a different example of the CAM cell of FIG. 6.

There are various methods as a method of realizing the reconfigurable PLA 6". However, a register and gates approach, which uses a register for storing the values of the respective bits of an input vector and an AND gate, is employed here. FIG. 8 is a view showing an configuration of the reconfigurable PLA 6" using the register and the gates. In FIG. 8, the reconfigurable PLA 6" is composed of n pieces of the registers 15, n pieces of EXNOR gates 16, and the one AND gate 17.

In the approach, words having any width can be arranged and they can be rearranged at a high speed. When the number of inputs is shown by n, the number of outputs is shown by q, and the weight of an address generation function to be realized is shown by k, the number of LE (Log Elements) which is necessary when the reconfigurable PLA 6" of FIG. 8 is composed of FPGA is as shown by Expression 39.

[Expression 39]

$$\left(\lceil \frac{n}{2} \rceil + \lceil \frac{2n-1}{3} \rceil\right)k + \lceil \frac{\frac{k}{2}-1}{3} \rceil q \quad (23)$$

In the example, the number of registered vectors to be realized in the reconfigurable PLA 6" is 1730. Accordingly, the number of the LE, which is necessary to mount the reconfigurable PLA 6", is 84, 478 from a formula (23).

[Hybrid Method]

The ratio δ of the addresses which can be expressed by the tentative address generator 3 is as shown in Expression 40 from a formula (19).

[Expression 40]

$$\delta \simeq 1 - \frac{1}{2}\left(\frac{k}{2^p}\right) + \frac{1}{6}\left(\frac{k}{2^p}\right)^2 - 1 - \frac{1}{2}\left(\frac{1730}{2^{13}}\right) + \frac{1}{6}\left(\frac{1730}{2^{13}}\right)^2 \quad (24)$$

$$\simeq 0.901$$

The number of inputs of the hash memory 3' of FIG. 5 is p=13, and the number of outputs thereof is q=11. The number of inputs of the auxiliary memory 4' is q=11, and the number of outputs thereof is r=n−p=27. The size of the hash memory 3' is $2^{13} \times 11 = 90{,}112$ (bits). The size of the auxiliary memory 4' is $2^{11} \times 27 = 55{,}297$ (bits). Accordingly, the total amount of a memory size is 145,408 (bits). The number of the registered vectors realized by the reconfigurable PLA 6" is 173.

[Super Hybrid Method]

The ratio δ of the addresses, which can be expressed by the tentative address generator 3, is as shown by Expression 41 from the formula (19).

[Expression 41]

$$\delta \simeq 1 - \frac{1}{2}\left(\frac{k}{2^p}\right) + \frac{1}{6}\left(\frac{k}{2^p}\right)^2 - 1 - \frac{1}{2}\left(\frac{1730}{2^{12}}\right) + \frac{1}{6}\left(\frac{1730}{2^{12}}\right)^2 \quad (25)$$

$$\simeq 0.8185$$

The number of inputs of the first hash memory 3' of FIG. 7 is $p_1=12$, and the number of outputs thereof is $q_1=11$. The number of inputs of the first auxiliary memory 4' is $q_1=11$, and the number of outputs thereof is $r_1=n-p_1=27$. The number of inputs of the second hash memory 3' is $p_2=10$, and the number of outputs thereof is $q_2=9$. The number of inputs of the second auxiliary memory 4' is $q_2=9$, and the number of outputs thereof is $r_2=n-p_2=30$.

The size of the first hash memory 3' is $2^{12} \times 11 = 45{,}056$ (bits), the size of the first auxiliary memory 4' is $2^{11} \times 28 = 57{,}344$ (bits), the size of the second hash memory 3' is $2^{10} \times 9 = 9{,}216$ (bits), and the size of the second auxiliary memory 4' is $2^9 \times 30 = 15{,}360$ (bits). Accordingly, the total amount of the memory size is 126,976 (bits). The number of the registered vectors realized by the reconfigurable PLA 6" is 43. Accordingly, in the example, the super hybrid method can more reduce the amount of hardware.

The invention claimed is:

1. An address generator to perform operation of the address generation function f(X) which produces a unique address A corresponding to a binary input vector (hereinafter referred to simply as "input vector") X if said input vector is a registered vector, otherwise produces "invalid value", comprising:
   A. one or more master address generators to produce the unique address A corresponding to said input vector X if said input vector X belongs to a subset of a registered vector set, otherwise produce "invalid value";
   B. a slave address generator that produces the unique address A corresponding to said input vector X if all the outputs of the master address generators are "invalid value" and said input vector X which belongs to said registered vector set, otherwise performs operation of a slave address generation function $f_2(X)$ to produce "invalid value" or an unique address A corresponding to said input vector X; and
   C. an output combiner that produces the output value of the master address generator or the output value of the slave address generator as the unique address A if the output value of the master address generator or the slave address generator are not "invalid value", otherwise produces "invalid value"; wherein
   said master address generator comprising:
   a. a hash network to hash the bound variables $X_{1i}$ to produce the hashed bound variables $Y_{1i}$ for the partition $(X_{1i}, X_{2i})$ of the input vector X, where i denotes an index identifying master address generator;
   b. a tentative address generator that produces a unique address A as a tentative address A' if the unique address A corresponds one-to-one to said bound variables $Y_{1i}$ (i.e., when no hash collision occurs), otherwise (i.e., when hash collision occurs), produces an arbitrary value or one of the corresponding unique address A as a tentative address A';

c. a data re-generator that performs operation of data regeneration function $f^1(A)$, which is an inverse function of the address generation function $f(X)$, wherein regenerated vector $X''=f^1(A')$ is produced when said tentative address A' produced by said tentative address generator is applied, and d. a unique address detector that compares said regenerated vector X" with said input vector X, and produces said tentative address A' if they are identical, otherwise produces "invalid value"; and wherein said slave address generator is configured by an LUT cascade logic network, consisting of plural subfunction memories connected in a cascade, and said each subfunction memory stores subfunction, which is obtained by a functional decomposition of the slave address generation function $f_2(X)$, as an LUT.

2. The address generator as claimed in claim 1, wherein said slave address generator produces the unique address A corresponding to the input vector X if the input vector X produces the hash collision for the hashed bound variables $Y_{1i}$, otherwise produces "invalid value" in all of said master address generators.

3. The address generator as claimed in claim 1, wherein said tentative address generator is a hash memory storing the tentative address generate function as an LUT and the tentative address generate function produces the unique address A corresponding to the bound variables $Y_1$ as a tentative address A', if no hash collision occurs for the hashed bound variables $Y_1$.

4. The address generator as claimed in claim 1, wherein said data re-generator is an auxiliary memory storing the data regeneration function $f^1(A)$ as an LUT.

* * * * *